(12) United States Patent
Ellinger et al.

(10) Patent No.: US 9,391,210 B2
(45) Date of Patent: Jul. 12, 2016

(54) TOP GATE TFT WITH POLYMER INTERFACE CONTROL LAYER

(71) Applicants: Carolyn Rae Ellinger, Rochester, NY (US); Shelby Forrester Nelson, Pittsford, NY (US)

(72) Inventors: Carolyn Rae Ellinger, Rochester, NY (US); Shelby Forrester Nelson, Pittsford, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 17 days.

(21) Appl. No.: 14/487,184

(22) Filed: Sep. 16, 2014

(65) Prior Publication Data

US 2016/0079429 A1    Mar. 17, 2016

(51) Int. Cl.
*H01L 29/10* (2006.01)
*H01L 29/786* (2006.01)
*H01L 29/417* (2006.01)

(52) U.S. Cl.
CPC ...... *H01L 29/7869* (2013.01); *H01L 29/41733* (2013.01)

(58) Field of Classification Search
CPC .................................................. H01L 29/78696
USPC .......................................................... 257/43
See application file for complete search history.

(56) References Cited

U.S. PATENT DOCUMENTS

| 8,373,168 | B2 | 2/2013 | Yan et al. |
| 8,502,221 | B2 * | 8/2013 | Yamazaki ............ H01L 29/7869 257/410 |
| 8,643,006 | B2 | 2/2014 | Chen et al. |
| 2009/0130858 | A1 | 5/2009 | Levy |
| 2014/0193945 | A1 * | 7/2014 | Li .......................... H01L 21/463 438/104 |
| 2014/0217395 | A1 * | 8/2014 | Facchetti ............ H01L 29/7869 257/43 |

OTHER PUBLICATIONS

Hong et al., Passivation of Zinc-Tin-Oxide Thin-Film Transistors, *J. Vac. Sci. Technol.* B 23(6), Nov./Dec. 2005, pp. L25-L27.
Ferrari et al., "Atomic Layer Deposited Al$_2$O$_3$ as a Capping layer for Polymer Based Transistors", *Organic Electronics* 8 (2007), pp. 407-414.
Mourey et al., Passivation of ZnO TFTs, *Journal of the SID* 18/10, 2010, pp. 753-761.
Yang et al., "High-Performance Al—Sn—Zn—In—O Thin-Film Transistors: Impact of Passivation Layer on Device Stability", *IEEE Electron Device Letters*, vol. 31, No. 2, Feb. 2010, pp. 144-146.
Levy et al., "Metal-Oxide Thin-Film Transistors Patterned by Printing", *Applied Physics Letters* 103, 043505 (2013), pp. 043505-1-043505-4.

(Continued)

*Primary Examiner* — Chandra Chaudhari
(74) *Attorney, Agent, or Firm* — William R. Zimmerli

(57) ABSTRACT

A transistor includes a substrate and a polymer layer that is in contact with the substrate. The polymer layer has a first pattern defining a first area. There is an inorganic semiconductor layer over and in contact with the polymer layer that has a second pattern defining a second area. The first area is located within the second area. There is a source electrode in contact with a first portion of the semiconductor layer and a drain electrode in contact with a second portion of the semiconductor layer, and the source electrode and the drain electrode separated by a gap. A gate insulating layer is in contact with the inorganic semiconductor layer in the gap. There is a gate in contact with the gate insulating layer over the gap.

11 Claims, 21 Drawing Sheets

(56) References Cited

OTHER PUBLICATIONS

Olziersky et al., "Insight on the SU-8 Resist as Passivation Layer for Transparent $Ga_2O_3$—$In_2O_3$—$ZnO$ Thin-Film Transistors", *Journal of Applied Physics* 108, 064505 (2010), pp. 064505-1-064505-7.

Kim et al., "Fast and Stable Solution-Processed Transparent Oxide Thin-Film Transistor Circuits", *IEEE Electron Device Letters*, vol. 32, No. 4, Apr. 2011, pp. 524-526.

Görrn et al., "Encapsulation of Zinc Tin Oxide Based Thin Film Transistors", *J. Phys. Chem. C* 2009, 113, pp. 11126-11130.

Jeong et al., "Origin of Threshold Voltage Instability in Indium—Gallium—Zinc Oxide Thin Film Transistors", *Applied Physics Letters* 93, 123508 (2008), pp. 123508-1-123508-3.

Dodabalapur et al., "Organic Transistors Two Dimensional Transport and Improved Electrical Characteristics", *Science*, Apr. 1995, pp. 270-271.

Sze, "Physics of Semiconductor Devices", *Semiconductor Devices—Physics and Technology*, John Wiley & Sons, 1981, pp. 438-443.

\* cited by examiner

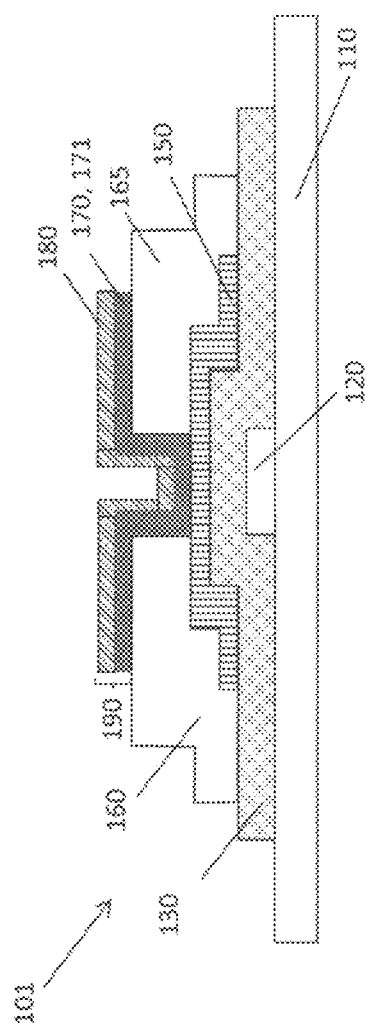
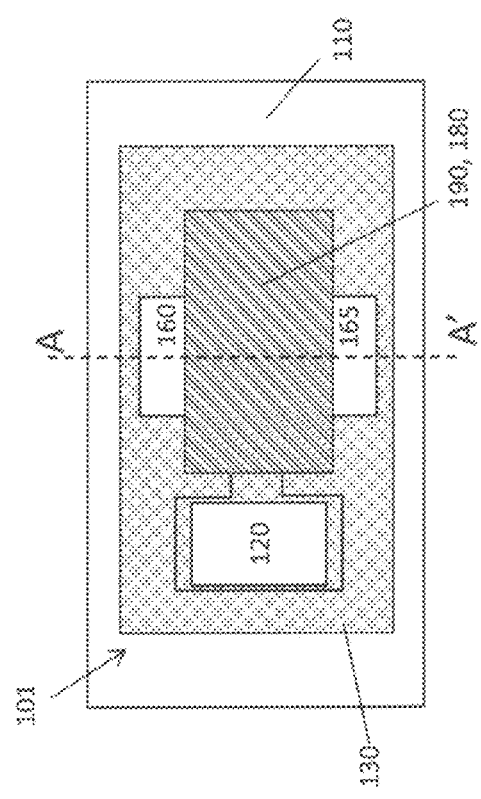
Figure 1a
Figure 1b

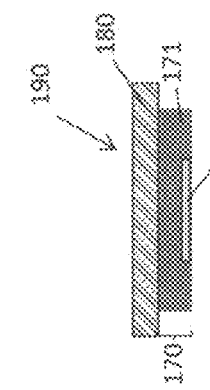
Figure 2a
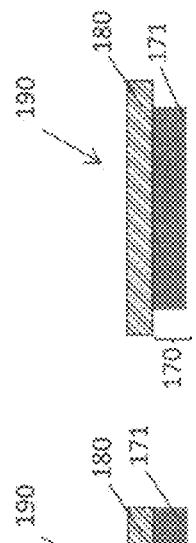
Figure 2c
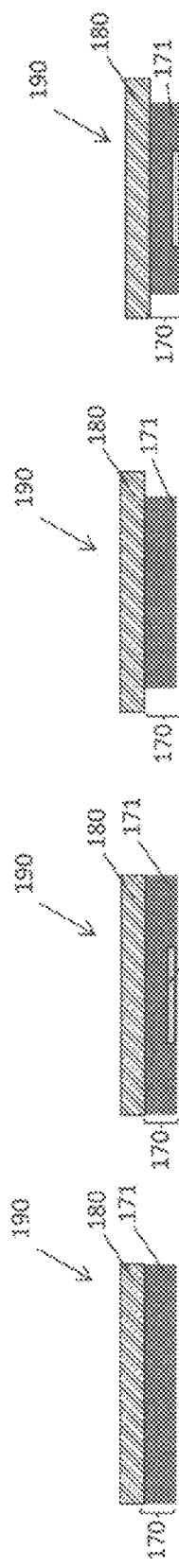
Figure 2e
Figure 2g
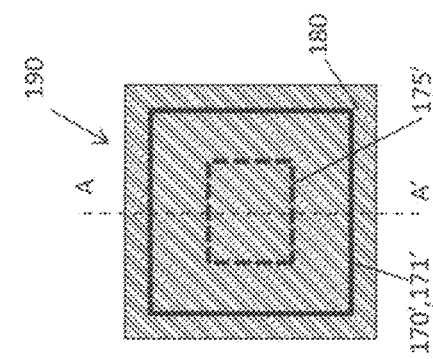
Figure 2b
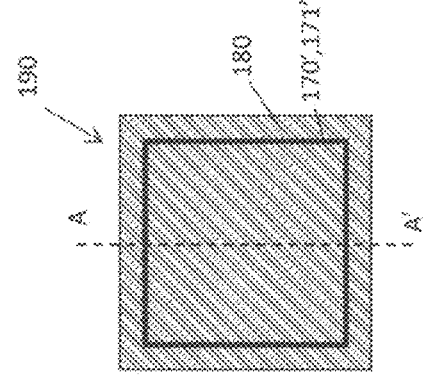
Figure 2d
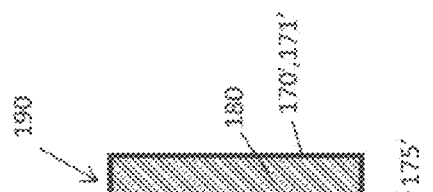
Figure 2f
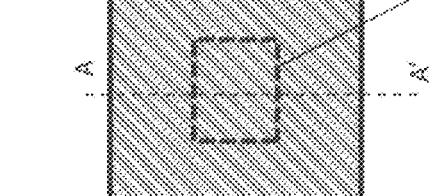
Figure 2h

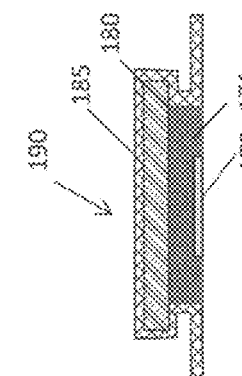
*Figure 2i*
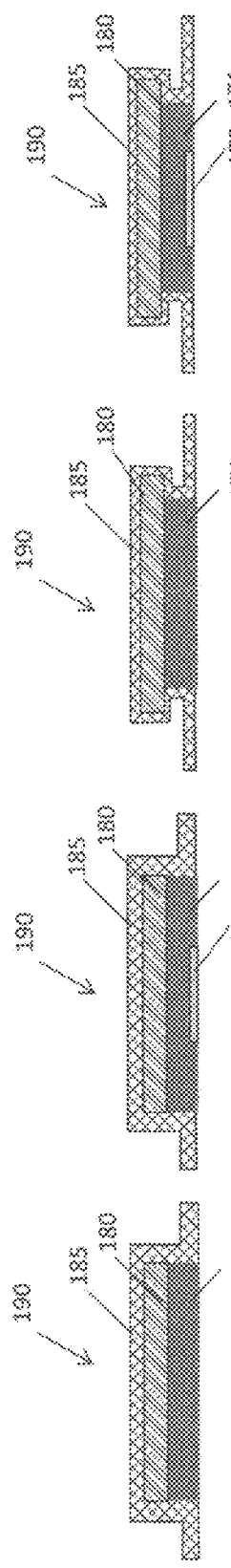
*Figure 2k*
*Figure 2m*
*Figure 2o*
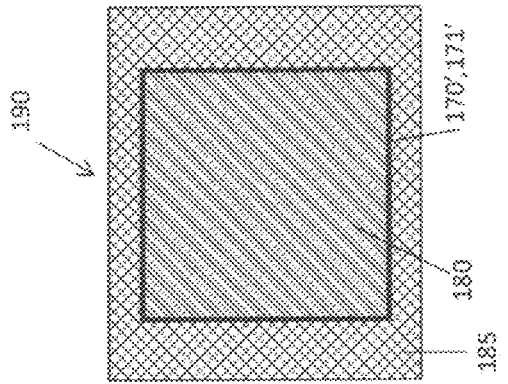
*Figure 2j*
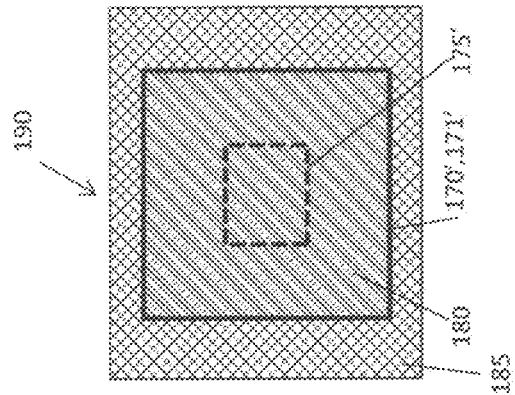
*Figure 2l*
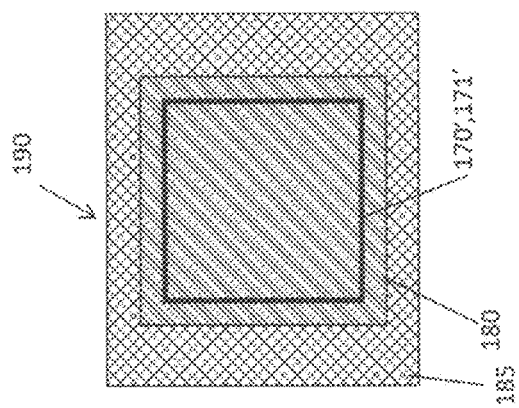
*Figure 2n*
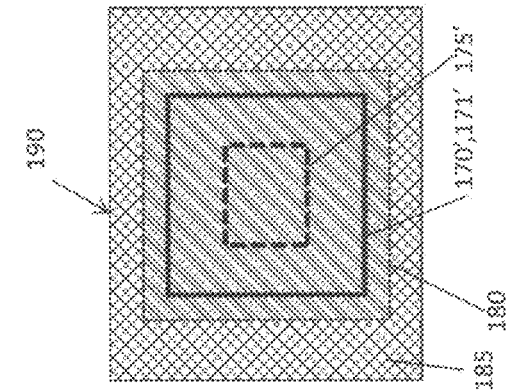
*Figure 2p*

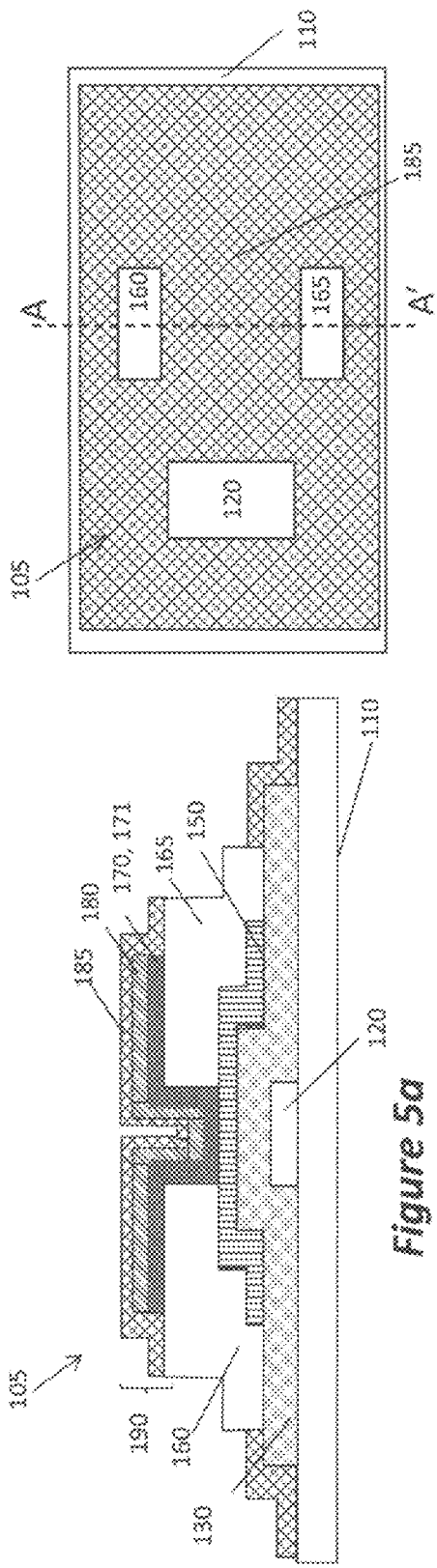
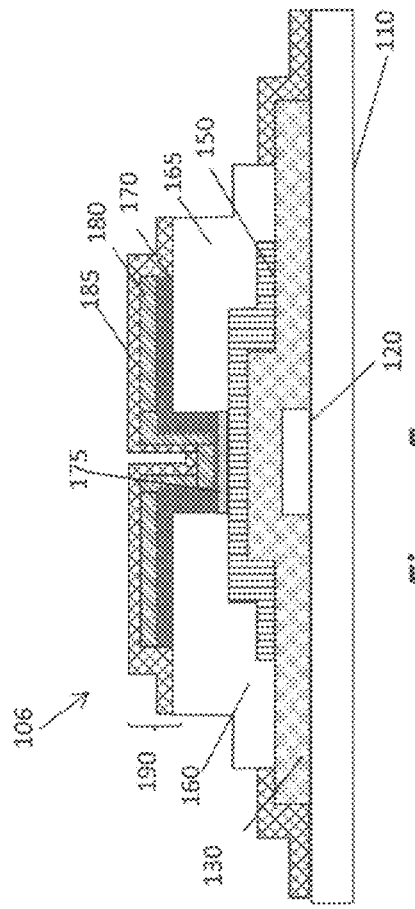
Figure 5a
Figure 5b
Figure 5c

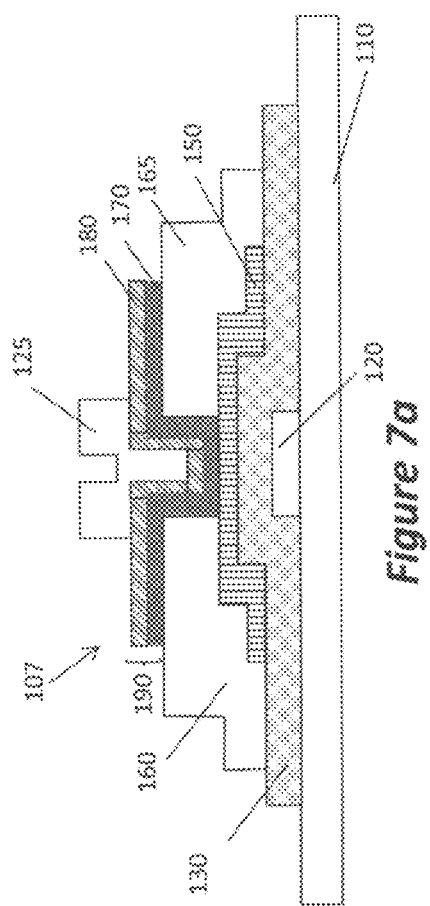
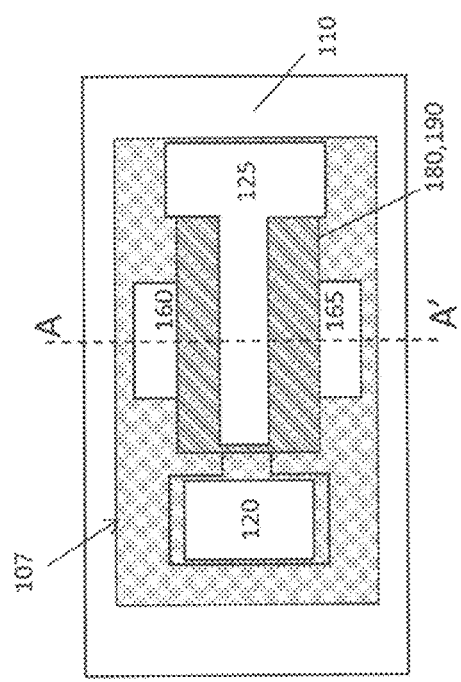
Figure 7a
Figure 7b

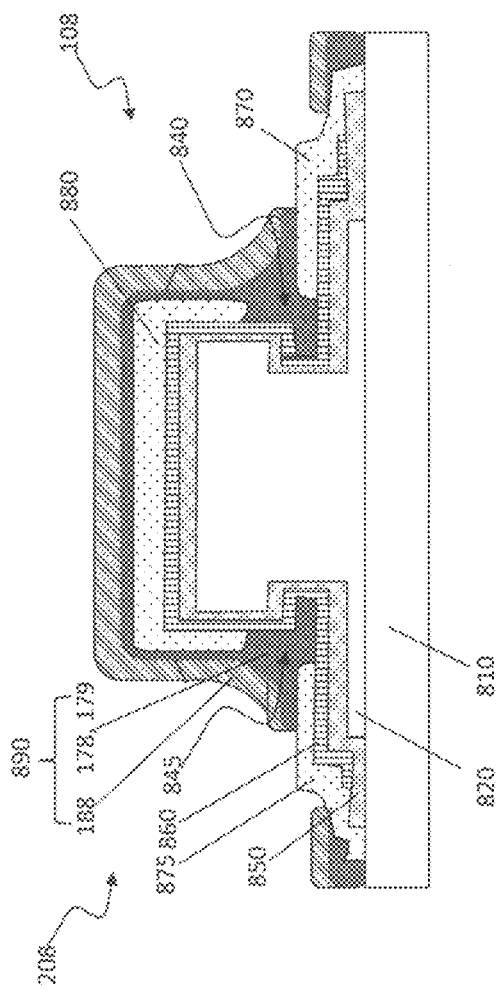
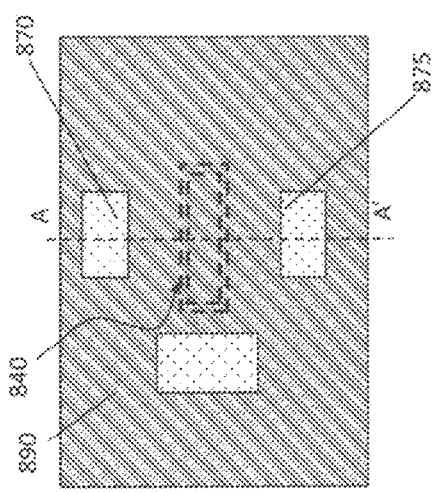
Figure 8a
Figure 8b

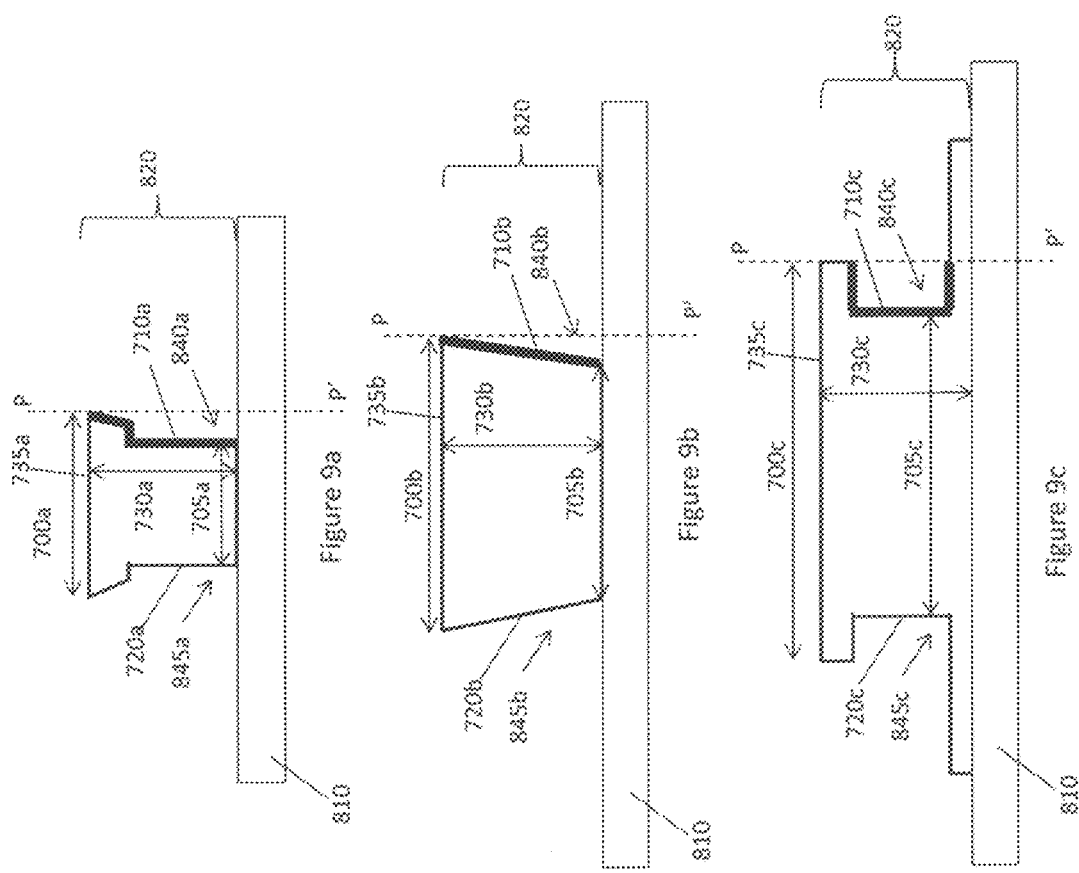

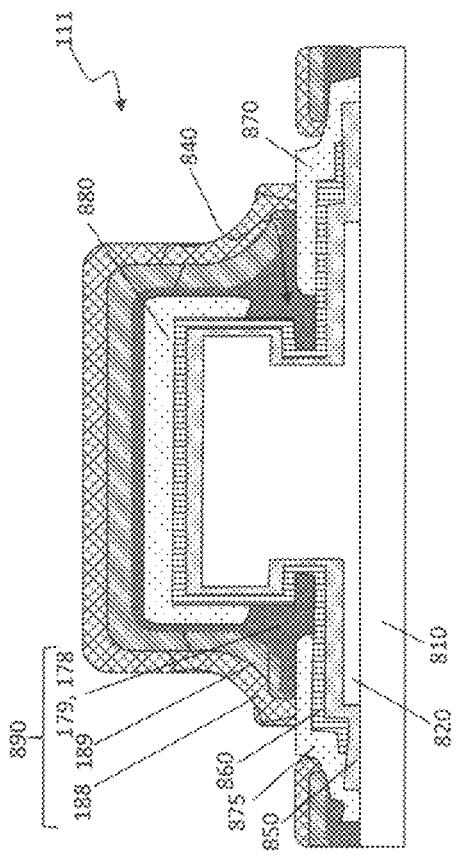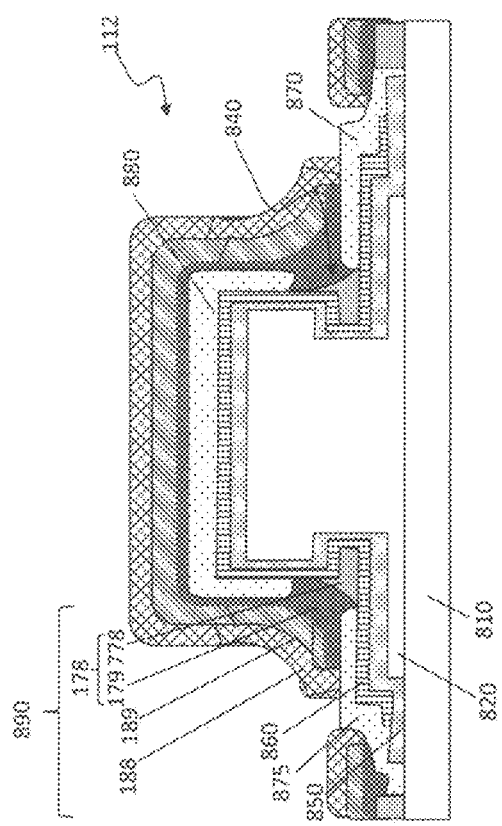

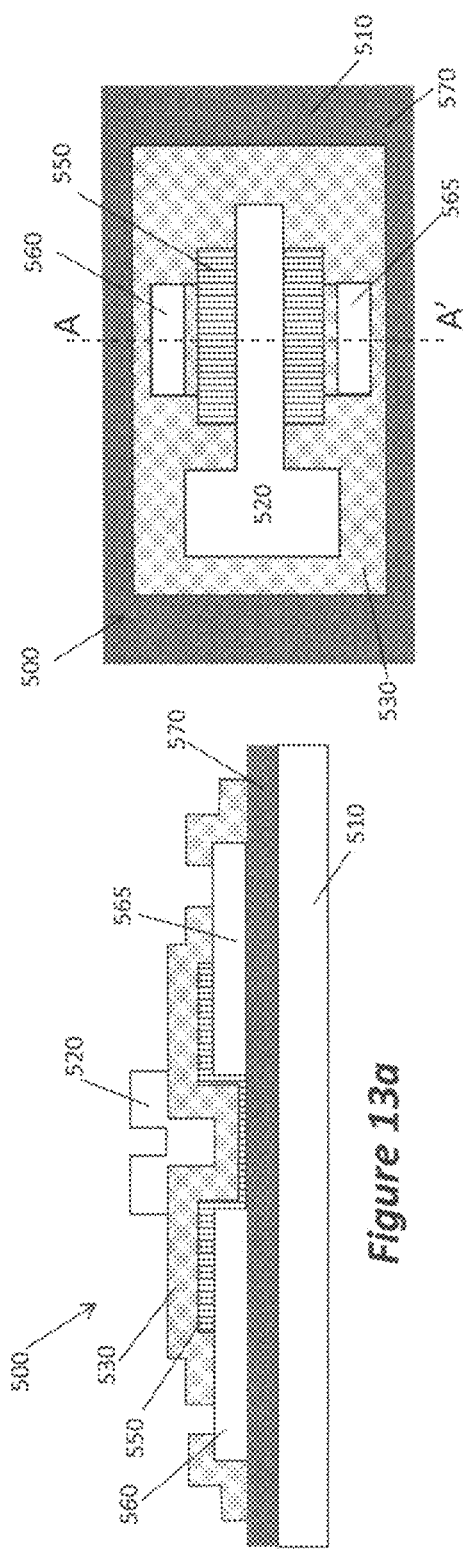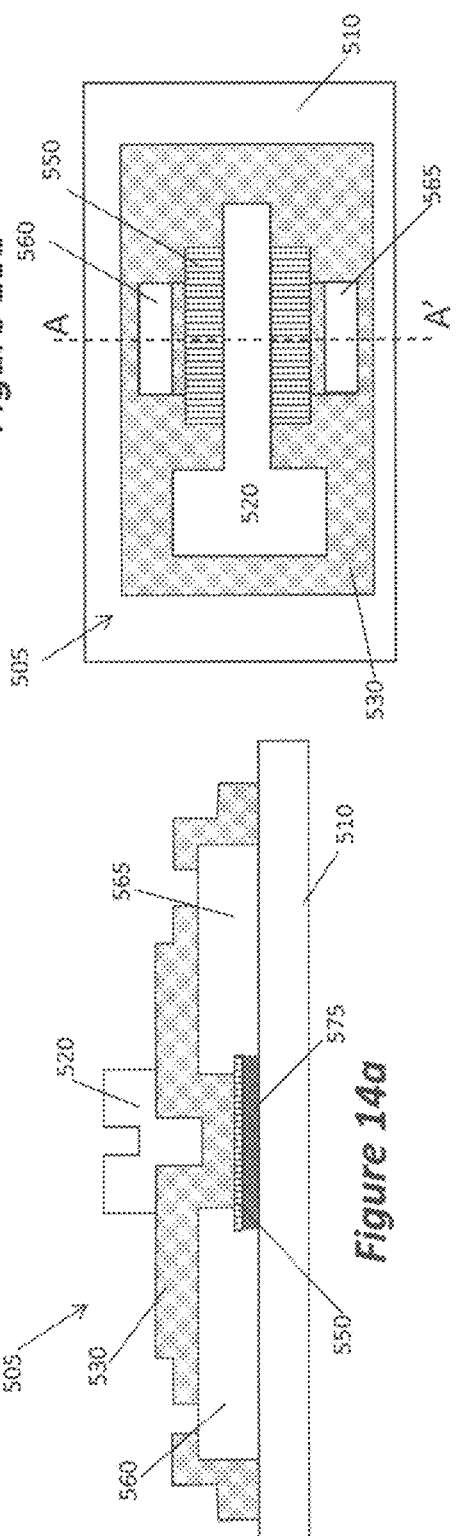
Figure 13a Figure 13b Figure 14a Figure 14b

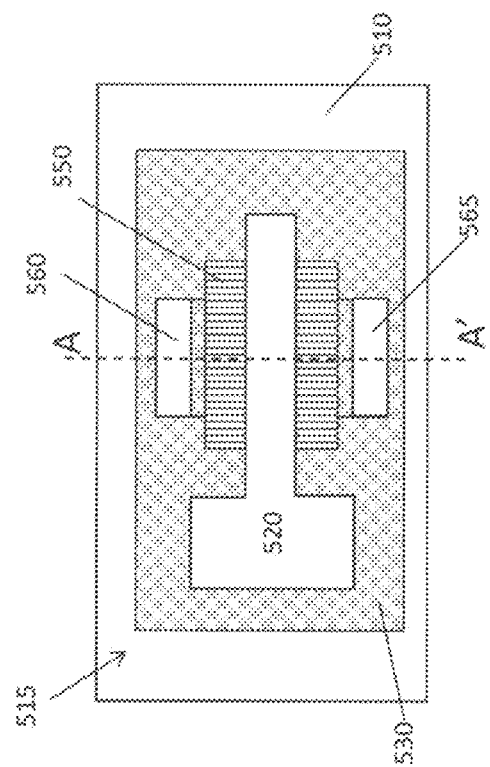
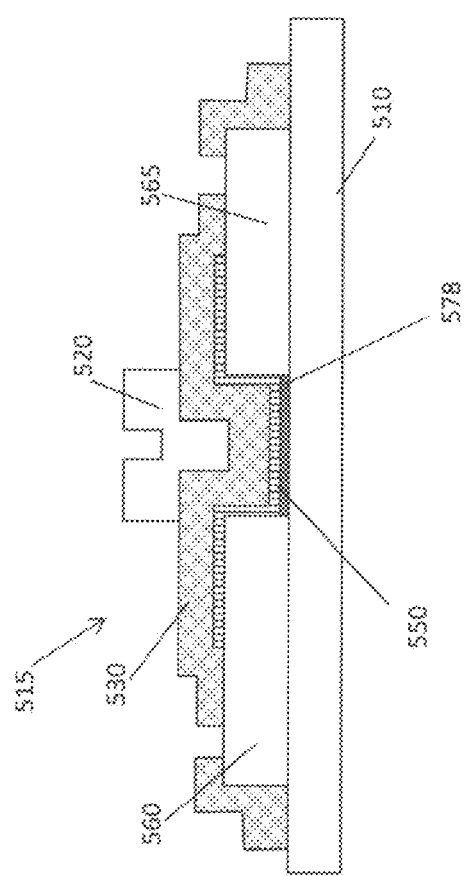
Figure 15b
Figure 15a

TOP GATE TFT WITH POLYMER INTERFACE CONTROL LAYER

CROSS REFERENCE TO RELATED APPLICATIONS

Reference is made to commonly-assigned, U.S. patent applications Ser. No. 14/487,150, entitled "VERTICAL TFT WITH MULTILAYER PASSIVATION", Ser. No. 14/487,161, entitled "BOTTOM GATE TFT WITH MULTILAYER PASSIVATION", Ser. No. 14/487,216, entitled "METHOD OF FORMING A PATTERNED POLYMER LAYER", all filed Sep. 14, 2014.

FIELD OF THE INVENTION

This invention relates generally to patterned thin film fabrication and to electronic and optoelectronic devices including patterned thin film multilayer dielectric structures. In particular, this invention relates to selective area deposition of materials including, for example, metal-oxides in combination with polymer dielectric materials and devices including, for example, thin film transistors produced using this fabrication technique.

BACKGROUND OF THE INVENTION

Modern-day electronics require multiple patterned layers of electrically or optically active materials, sometimes over a relatively large substrate. Electronics such as radio frequency identification (RFID) tags, photovoltaics, optical and chemical sensors all require some level of patterning in their electronic circuitry. Flat panel displays, such as liquid crystal displays or electroluminescent displays (for example, OLED), rely upon accurately patterned sequential layers to form thin film components of the backplane. These components include capacitors, transistors, and power buses. The industry is continually looking for new methods of materials deposition and layer patterning for both performance gains and cost reductions. Thin film transistors (TFTs) are one common electronic component, and can serve to illustrate the manufacturing issues for many thin film components. TFTs are widely used as switching elements in electronics, for example, in active-matrix liquid-crystal displays, smart cards, and a variety of other electronic devices and components thereof.

In the past decade, various materials have received attention as a potential alternative to amorphous silicon for use in semiconductor channels of thin film transistors. Semiconductor, dielectric, conducting, and protective materials that are simpler to process are desirable, especially those that are capable of being applied to large areas by relatively simple processes. The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications.

A semiconductor material useful in a TFT must display several characteristics. In typical applications of a thin film transistor, the desire is for a switch that can control the flow of current through the device. As such, it is desired that when the switch is turned on a high current can flow through the device. The extent of current flow is related to the semiconductor charge carrier mobility. When the device is turned off, it is desired that the current flow be very small. The ratio between current flow in the on state to current flow in the off state is related to the native charge carrier concentration. It is further desired that the device remain unchanged during operation. The stability of transistors is typically evaluated by holding the device under a constant stress (or bias) that is consistent with the stress applied to the transistor in operation for a given application.

Many electronic devices benefit from the presence of either a passivation layer or a barrier layer or both. Thin film metal oxide TFTs, such as ZnO, GIZO, or GZO, have instabilities that can limit their adoption in practical applications. There has been a concerted effort recently to improve the stability of these types of TFTs with passivation layers. Typical passivation layer structures employ inorganic thin films as the passivation layer, such as $Al_2O_3$. The use of these inorganic passivation layers typically induces a negative threshold shift that can be undesirable. Complicated processing schemes have been introduced to passivate with inorganic materials without threshold shifts. Alternatively, researchers have used multilayer channels to modify the charge on the back channel, for instance using two different stoichiometries of IGZO for the semiconductor layer. There has been limited work done to passivate inorganic TFTs with photopatternable polymers, with varied response. In most cases, a negative shift in threshold voltage is still present with passivation and the processing involves the complex multistep process associated with photolithography and additional post deposition annealing steps. There remains a need for a passivation process for metal oxide transistors which is simple, and which results in TFTs stable under bias stress without an associated shift in threshold shift from the unpassivated state.

Furthermore, it is recognized in the art that the material that is in contact with the back channel of a semiconductor has an impact on the performance of the transistor. In the aforementioned cases, the passivation layer is deposited on the back channel of a bottom gate device. In other architectures, controlling the back channel interface is still important even when the material layer does not impact the environmental stability of the device. For instance, in the case of top gate TFTs it has been observed that ZnO-based transistors built on glass have very negative threshold voltages. There remains a need for device structures and material layers that control the back channel interface in all types of device architectures including bottom gate transistors, top gate transistors, and vertical transistors.

Atomic layer deposition (ALD) can be used as a fabrication step for forming a number of types of thin-film electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors. Examples of useful semiconducting materials are compound semiconductors such as gallium arsenide, gallium nitride, cadmium sulfide, zinc oxide, and zinc sulfide. A dielectric material is any material that is a poor conductor of electricity, often also referred to as an insulator material. Such materials typically exhibit a bulk resistivity greater than $10^{10}$ Ω-cm. Examples of dielectrics are $SiO_2$, HfO, ZrO, SiNx, and $Al_2O_3$.

There has been growing interest in combining ALD with a technology known as selective area deposition (SAD). As the name implies, selective area deposition involves treating portion(s) of a substrate such that a material is deposited only in those areas that are desired, or selected. These methods have been used to fabricate devices, as described in Appl. Phys. Lett. 2013, 103 (4), 043505 by Levy, et. al. There are many potential advantages to selective area deposition techniques, such as eliminating an etch process for film patterning, reduction in the number of cleaning steps required, and patterning of materials which are difficult to etch. There, however, persists a problem of combining multiple SAD steps to form working devices, in combination with organic elements in a device. In some device architectures, the removal of the inhibitor used in selective area deposition can damage or otherwise negatively impact the underlying layer. There remains a need for methods to fabricate devices with organic elements as well as SAD methods that do not require the removal of the deposition inhibitor.

Accordingly, there still remains a need for high-quality passivation and back channel control layers that result in stable, high-quality devices and that can be formed with simple processing methods. Correspondingly, a method is needed to simply pattern this layer for easy device integration. Furthermore there is a need for novel processes for forming multilayer insulating structures using selective area processes.

SUMMARY OF THE INVENTION

According to an aspect of the invention, a transistor includes a substrate and a polymer layer that is in contact with the substrate. The polymer layer has a first pattern defining a first area. There is an inorganic semiconductor layer over and in contact with the polymer layer that has a second pattern defining a second area. The first area is located within the second area. There is a source electrode in contact with a first portion of the semiconductor layer and a drain electrode in contact with a second portion of the semiconductor layer, and the source electrode and the drain electrode separated by a gap. A gate insulating layer is in contact with the inorganic semiconductor layer in the gap. There is a gate in contact with the gate insulating layer over the gap.

BRIEF DESCRIPTION OF THE DRAWINGS

In the detailed description of the example embodiments of the invention presented below, reference is made to the accompanying drawings, in which:

FIGS. 1a and 1b are a cross-sectional view and plan view, respectively, of one embodiment of a thin film transistor having a multilayer insulating structure of the present invention;

FIGS. 2a, 2c, 2e, 2g, 2i, 2k, 2m, and 2o are cross sectional views of the plan views of FIGS. 2b, 2d, 2f, 2h, 2j, 2l, 2n and 2p respectively, illustrating various embodiments of the multilayer insulating structure of the present invention;

FIGS. 5a and 5c are cross-sectional views of the plan view of FIG. 5b that illustrate embodiments of the present invention multilayer insulating structure having two inorganic insulating layers;

FIG. 5b in a plan view of the embodiments shown in FIGS. 5a and 5c;

FIG. 6b is a plan view of the embodiment shown in FIG. 6a;

FIGS. 7a and 7b are cross-sectional views and plan views, respectively, of an embodiment of a dual-gate thin film transistor having a multilayer insulating structure of the present invention;

FIGS. 8a and 8b are a cross-sectional view and plan view, respectively, of an embodiment of a vertical thin film transistor having a multilayer insulating structure of the present invention as a passivation layer;

FIGS. 9a, 9b and 9c illustrate alternative geometries of gate structures for vertical transistors of the present invention;

FIG. 11 is another embodiment of a multilayer insulating structure of the present invention having two inorganic insulating layers used to passivate a vertical TFT;

FIG. 12 is another embodiment of a multilayer insulating structure of the present invention having two polymer layers and two inorganic insulating used to passivate a vertical TFT;

FIGS. 13a and 13b are a cross-sectional view and plan view, respectively, of a top-gate thin film transistor formed over a uniform polymer layer;

FIGS. 14a and 14b are a cross-sectional view and plan view, respectively, of a top-gate thin film transistor of the present invention formed over a polymer layer having the same pattern as the semiconductor layer;

FIGS. 15a and 15b are a cross-sectional view and plan view, respectively, of a top-gate thin film transistor of the present invention formed over a polymer layer having a different pattern from the pattern of the semiconductor;

DETAILED DESCRIPTION OF THE INVENTION

Figure 3:
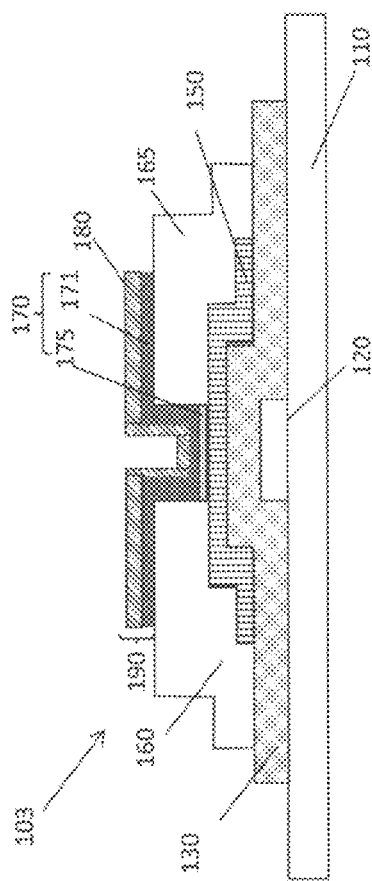
FIG. 3 is another embodiment of a multilayer insulating structure of the present invention having two polymer layers used to passivate a bottom gate TFT.

The following description is directed in particular to elements forming part of, or cooperating more directly with, apparatus in accordance with the present invention. It is to be understood that elements not specifically shown or described may take various forms well known to those skilled in the art. In the following description and drawings, identical reference numerals have been used, where possible, to designate identical elements. It is to be understood that elements and components can be referred to in singular or plural form, as appropriate, without limiting the scope of the invention.

The example embodiments of the present invention are illustrated schematically and not to scale for the sake of clarity. One of the ordinary skills in the art will be able to readily determine the specific size and interconnections of the elements of the example embodiments of the present invention.

Throughout the specification and claims, the following terms take the meanings explicitly associated herein, unless the context clearly dictates otherwise. The meaning of "a," "an," and "the" includes plural reference, the meaning of "in" includes "in" and "on." Additionally, directional terms such as "on", "over", "top", "bottom", "left", "right" are used with reference to the orientation of the Figure(s) being described. Because components of embodiments of the present invention can be positioned in a number of different orientations, the directional terminology is used for purposes of illustration only and is in no way limiting.

A stable enhancement-mode transistor is a transistor in which there is negligible off-current flow relative to on-current flow between a source and a drain at zero gate voltage. In other words, the transistor device is normally off. In contrast, a depletion-mode transistor is normally on meaning that more than substantially negligible current flows between a source and a drain at zero gate voltage.

When the TFT operates in an enhancement-mode, the charges injected from the source electrode into the semiconductor are mobile and a current flows from source to drain, mainly in a thin channel region within about 100 Angstroms of the semiconductor-dielectric interface. See A. Dodabalapur, L. Torsi H. E. Katz, *Science* 1995, 268, 270, hereby incorporated by reference. In the absence of a gate field the channel ideally has few charge carriers; as a result there is ideally no source-drain conduction when the device is in off mode.

The off-current in an enhancement-mode device is defined as the current flowing between the source electrode and the drain electrode when charge has not been intentionally injected into the channel by the application of a gate voltage. This occurs for a gate-source voltage more negative, assuming an n-channel device, than a certain voltage known as the threshold voltage. See Sze in *Semiconductor Devices—Physics and Technology*, John Wiley & Sons (1981), pages 438-443, hereby incorporated by reference. The on-current is defined as the current flowing between the source electrode and the drain electrode when charge carriers have been accumulated intentionally in the channel by application of an appropriate voltage to the gate electrode and the channel is conducting. For an n-channel accumulation-mode TFT, this occurs at a gate-source voltage more positive than the threshold voltage. It is desirable for this threshold voltage to be slightly positive, for n-channel operation. Switching between on and off states is accomplished by the application and removal of an electric field from the gate electrode across the gate dielectric to the semiconductor-dielectric interface, effectively charging a capacitor.

Attractive TFT device characteristics include a high ratio of the on-current to the off-current, and a steep sub-threshold slope. In the operation of such a TFT device, a voltage applied between the source and drain electrodes establishes a substantial current flow only when the control gate electrode is energized. That is, the flow of current between the source and drain electrodes is modulated or controlled by the bias voltage applied to the gate electrode. The relationship between material and device parameters of the zinc-oxide-based semiconductor TFT can be expressed by the approximate equation (see Sze in *Semiconductor Devices—Physics and Technology*, John Wiley & Sons (1981)):

$$I_d = \frac{W}{2L}\mu C_{ox}(V_g - V_{th})^2$$

where $I_d$ is the saturation source-drain current, $C_{ox}$ is the geometric gate capacitance associated with the insulating layer, W and L are physical device dimensions, μ is the carrier mobility in the zinc-oxide-based semiconductor, $V_g$ is the applied gate voltage, and $V_{th}$ is the threshold voltage. Ideally, the TFT allows passage of current only when a gate voltage of appropriate polarity is applied. However, with zero gate voltage, the off current between source and drain depends on the intrinsic conductivity a of the zinc-oxide-based semiconductor as well as the state of the semiconductor back channel. It has been found that for metal oxide transistors the interface of the semiconductor opposite the gate, often called the back channel, plays a role in the device performance. The multilayer insulating structure of the present invention is useful to ensure that the metal oxide transistors operate in enhancement mode. Additionally, it is known that metal oxide transistors can be sensitive to environmental conditions. The multilayer insulating structures of the present invention also serve to protect the transistors from environmental conditions, thereby both passivating the device and providing barrier properties.

The TFT structures described herein include an inorganic semiconductor channel, preferably a metal-oxide-based semiconductor, with conducting electrodes, commonly referred to as a source and a drain, for injecting a current into the semiconductor and a capacitively coupled gate for controlling and/or modulating the source-drain current. Preferred metal oxide based semiconductors include ZnO based semiconductors. Examples of ZnO based semiconductors are ZnO, InZnO, InO, and InGaZnO and doped ZnO.

The production of inorganic thin film transistors and electronic devices from semiconductor, dielectric, conductive materials can be accomplished by conventional techniques known to the skilled artisan. The exact process sequence is determined by the structure of the desired transistor. Thus, in the production of a field effect transistor in a so-called inverted structure, a gate electrode can be first deposited on a substrate, for example a vacuum- or solution-deposited metal or organic conductor, or an ALD-deposited conductor. The gate electrode is insulated with a dielectric and the source and drain electrodes and a layer of the inorganic semiconductor material are applied on top. The structure of such a transistor, and hence the sequence of its production, are varied in the customary manner known to a person skilled in the art. Alternatively, a gate electrode is deposited first, followed by a gate dielectric, the semiconductor is applied, and finally the contacts for the source electrode and drain electrode are deposited on the semiconductor layer. In an alternative third structure, often called a top-gate structure, the source and drain electrodes are deposited first, then the semiconductor is deposited, and finally the dielectric and gate electrode are deposited on top. In yet another embodiment, the semiconductor is deposited first, prior to depositing the source and drain electrodes. In most embodiments, a field effect transistor includes an insulating layer, a gate electrode, a semiconductor layer including an inorganic material as described herein, a source electrode, and a drain electrode, wherein the insulating layer, the gate electrode, the semiconductor layer, the source electrode, and the drain electrode are in any sequence as long as the gate electrode and the semiconductor layer contact opposite sides of the insulating layer and the source electrode and the drain electrode both contact the semiconductor layer.

For conductive layers, such as those used for the gate, source, and drain electrodes, useful materials include metals and conductive metal oxides. Examples of useful conductors include Al, Cr, Mo, Ag, aluminum doped ZnO (AZO), and indium doped tin oxide (ITO). The gate dielectric can be an inorganic gate dielectric, for example an insulating metal oxide such as aluminum oxide, HfO, ZrO, or SiO2. The inorganic semiconductor layer can be a metal oxide semiconductor, for example a ZnO based semiconductor. These layers of the TFT can be deposited using any method known in the art, including CVD, PECVD, sputtering or evaporation. ALD is a useful method of deposition, and more specifically spatial ALD due to the low required processing temperature. The active layers can be patterned using methods including, selective deposition, sequential masking, photolithography, laser, and/or other means known to the skilled artisan.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by exposing the substrate to alternate cycles of two or more reactive materials, commonly referred to as precursors. Traditional ALD systems are chamber based, and operate under vacuum. In a typical process, a first precursor is applied to react with the substrate, followed by the removal of the excess of the first precursor from the vacuum chamber. Next, a second precursor is applied to react with the first precursor on the substrate, followed by the removal of the excess of the second precursor from the vacuum chamber. This process is repeated to build up the coating thickness with each reaction happening only at the substrate surface.

In a preferred embodiment, ALD can be performed at or near atmospheric pressure and over a broad range of temperatures, preferably at a temperature of under 300° C. Optionally, the present process can be accomplished using a new ALD process which negates the need for a vacuum chamber. This process, commonly referred to as S-ALD, is described in at least one of commonly assigned U.S. Pat. Nos. 7,413,982; 7,456,429; 7,789,961; and US Patent Application Publication No. US 2009/0130858. All of the above-identified patents and patent applications are incorporated by reference herein in their entirety.

S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large-scale production operations. Even though some web coating operations may experience alignment issues, for example, web tracking or stretching issues, the vertical transistor architectures of some embodiments of the present invention can reduce reliance on high resolution or very fine alignment features during the manufacturing process. Therefore, S-ALD is well suited for manufacturing the present invention.

The preferred process of the present invention employs a continuous spatially dependent (as opposed to pulsed or time-dependent ALD) gaseous material distribution. The process of the present invention allows operation at atmospheric or near-atmospheric pressures and is capable of operating in an unsealed or open-air environment. The process of the present invention is adapted so that material is deposited only in selected areas of a substrate.

Metal oxides are particularly suited for deposition using ALD, particularly S-ALD. These include, but are not limited to: zinc oxide (ZnO), aluminum oxide (often called $Al_2O_3$, though stoichiometry is not necessarily exact), hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, $Mg_xZn_{1-x}O$, and LiZnO.

Returning now to the discussion of the transistor, in embodiments of the novel TFTs of the present invention, the back channel of the inorganic semiconductor (the side opposite the gate) is in contact with a polymer dielectric layer. For bottom-gate devices, that means there is a multilayer insulating structure of the current invention in contact with the semiconductor. For top-gate devices, there is a polymer dielectric under, and in contact with, the inorganic semiconductor layer for charge-control purposes. The specific examples of transistor configurations described herein are for illustrative purposes and should not be considered as limiting the scope of the invention.

Embodiments of the present invention relate to polymer insulating layers useful in controlling the back channel of inorganic semiconductor thin film transistors and to multilayer insulating structures containing polymer insulating layers and thin film inorganic insulating layers. Additionally, a novel method for forming a useful multilayer insulating structure is disclosed that uses selective area deposition (SAD) in combination with atomic layer deposition (ALD). As discussed above, the inorganic thin film transistors can be formed by any process known in the art. Preferred methods of fabricating the transistors include using SAD in combination with spatial ALD.

The phrase "polymer dielectric" as used herein refers to a polymeric material used as an electrically insulating layer and that is present in the final application, and is useful to distinguish the polymer dielectric material from other polymeric materials or polymer layers that may be used in the process. The polymer insulating layer of the multilayer insulating structure is composed of a polymer dielectric. Similarly, the polymer structure of the multilayer dielectric structures is composed of one or more layers of polymer insulating layers. The polymer dielectric of the present invention is preferably a polymer that can be solution deposited, and is mechanically stable in the final application. Illustrative of polymer dielectrics are polyimides, phenoxy resins, acrylic resin, epoxy resins, polyacrylates, polyvinyl phenol, polyvinyl pyrrolidone, organosiloxanes (such as PDMS) and the like or their combinations and blends. The preferred polymer dielectrics are epoxy resins and polyimides. The polymer can be curable, with either thermal or radiation curable composition. The polymer does not need to be radiation curable or photosensitive, but photosensitive formulations are useful in the present invention so long as the final cured polymer layer has the structural and mechanical properties required in the final application. Polyimide is a preferred structural polymer dielectric due to the combination of film properties such as low stress, low CTE, low moisture uptake, high modulus and good ductility for microelectronic applications. Epoxy resins are also preferred due to their thermal and chemical properties. Radiation curable compositions comprising a highly branched, multifunctional epoxy bisphenol A-novolac resins, such as Epon SU-8 from Momentive Specialty Chemicals Inc. is one example of a useful epoxy resin.

Functionalized poly(siloxanes) include epoxy-functionalized, carboxyl-functionalized, polyether-functionalized, phenol-functionalized, amino-functionalized, alkoxy-functionalized, methacryl-functionalized, carbinol-functionalized, hydroxy-functionalized, vinyl-functionalized, acrylic-functionalized, silane-functionalized, trifluoro-functionalized, or mercapto-functionalized poly(organosiloxanes). Block copolymers can also be employed if containing substantial siloxane repeat units. Such polymers can be prepared as described in numerous patents and publications or are commercially available from, for example, General Electric Company, Schenectady, N.Y.; Dow Corning, Midland, Mich.; or Petrarch Systems, Bristol, Pa.

The polymer structure of the multilayer insulating structure is patterned. The patterning of the polymer structure is usefully accomplished using the patterned inorganic thin film insulating layer as a hard mask to etch a blanket-deposited polymer dielectric. Alternatively a "positive-acting" polymer (the polymer is removed where it has been exposed) can be used as the polymer dielectric, and the patterned inorganic thin film insulating layer can be used as a photo-mask for exposing the dielectric layer. In both cases, the resultant polymer insulating layer has a pattern that is defined by the pattern of the inorganic thin film layer. The pattern of the inorganic thin film layer defines a first area, the pattern of the polymer structure defines a second area, and the second area is located with the first area. The second area of the polymer structure does not extend beyond the first area of the inorganic dielectric layer. In some embodiments, the edges of the patterned polymer structure will be aligned with the edges of the patterned inorganic thin film insulating layer. In these embodiments, the first area and the second area are the same. In other embodiments, the edges of the patterned polymer structure will lie within the pattern of the edges of the patterned inorganic thin film insulating layer due to over etching or over exposure of the polymer dielectric. In these embodiments, the second area is smaller than the first area and is located within the first area. The polymer structure can be composed of one or more polymer layers; the pattern of the polymer structure is defined by the pattern of the polymer layer having the largest area.

In yet further embodiments, a second inorganic thin film layer can be conformally coated over the polymer insulating layer and the patterned inorganic layer, thus sealing the edges of both. In these embodiments it is preferred that the second inorganic thin film layer is also patterned. The pattern of the second inorganic thin film layer is such that the thin film layer seals the edges of the polymer and inorganic layer, but has openings allowing contact to, for instance, the electrodes of the TFT. The second inorganic thin film has a third pattern defining a third area that is larger than both the first and second areas. The patterned inorganic thin film dielectric can be formed in using any methods known in the art. Preferably, inorganic thin film dielectric is deposited using ALD, more preferably using spatial ALD. The inorganic thin film layer can be deposited uniformly and patterned using any method known in the art, including using a photolithographic process. Preferably, the inorganic thin film layer can be patterned as deposited by using the combination of selective area deposition (SAD) and ALD.

SAD employs a patterned material referred to as a "deposition inhibitor material", "deposition inhibiting material", or simply an "inhibitor" that inhibits the growth of a thin film material on the substrate when the substrate is subjected to an atomic layer deposition. By inhibiting the growth where the deposition inhibiting material is present, the deposition only occurs in regions (selective areas) of the substrate where the inhibitor is not present. The phrase "deposition inhibitor material" and its equivalents refer herein to any material on the substrate that inhibits the deposition of a film during atomic layer deposition (ALD). The "deposition inhibitor material" includes the material applied to the substrate as well as the material resulting from any optionally subsequent cross-linking or other reaction that modifies the material that may occur prior to depositing an inorganic thin film on the substrate by atomic layer deposition. A polymeric deposition inhibitor material may be cross-linked after applying the polymer onto the substrate, before or during the patterning step.

The deposition inhibitor material can be a compound or polymer that, after being applied, is subsequently polymerized, cross-linked, or polymerized and cross-linked. Examples of polymers include a poly(perfluoroalkyl methacrylate); poly(perfluoroalkyl methacrylate); poly(methyl methacrylate); poly(cyclohexyl methacrylate); poly(benzyl methacrylate); poly(iso-butylene); poly(9,9-dioctylfluorenyl-2,7-diyl); poly(hexafluorobutyl methacrylate), and copolymers thereof, wherein the alkyl has one to six carbon atoms.

Cross-linking can be used to insolubilize a polymeric deposition inhibitor material after application onto the surface of the substrate. The crosslinking can occur prior to patterning or may occur during patterning in order to contribute to the patterning step, for example, by employing crosslinking initiated by, and patterned by, actinic radiation, followed by removal of non-crosslinked polymer, for example, by solvent.

The polymeric inhibitor may be soluble in any convenient solvent and may have any useful molecular weight, preferably in the range of 2,000 to 2,000,000. It may include a single functional group, or may include a plurality of functional groups. In the case of a plurality, the polymer may be a random, periodic, or block polymer. For polymers with chiral centers the polymer may be isotactic, syndiotactic, or atactic. The polymer may have side chains and may be a graft copolymer. The polymer may be linear or branched. The polymer may have low numbers of free acid groups. Preferred polymers that are soluble in non-polar solvents are poly(methylmethcrylate) or epoxy resins. Polymers soluble in polar solvents such as water, alcohols, or ketones are particularly useful. Polymers may include amide groups, such as poly (amide), poly(vinylpyrollidone), and poly(2-ethyl-oxazoline. A particularly useful deposition inhibitor is poly(vinylpyrollidone).

The deposition of the deposition inhibitor material can be in a patterned manner, such as using inkjet, flexography, gravure printing, microcontact printing, offset lithography, patch coating, screen printing, or transfer from a donor sheet. In alternative embodiments, a uniform layer of the deposition inhibitor material can be deposited and then patterned to form a patterned layer of the deposition inhibitor material. Pre-processing treatments for patterning the inhibitor include patterning of substrate prior to inhibitor application to modify the hydrophobicity, electric charge, absorption, or roughness of the substrate. Post-processing treatments include light exposure, light exposure and subsequent liquid based development, plasma etching, and ablation.

Providing the patterned deposition inhibiting material layer on the substrate can include using at least one of an inkjet printing process, a flexographic printing process, a gravure printing process, and a photolithographic process. The active inhibiting material may be suspended or dissolved in a solvent or vehicle. The material may include surfactants, stabilizers, or viscosity modifiers. The printed material may be dried using natural convection, forced convection, or radiant heat. The material may be treated to change its morphology or chemical composition. A preferred chemical composition change is to crosslink the material. The change in morphology or chemical composition may be accomplished by exposure to a vapor phase or liquid phase reactant, or treatment with heat or light. Preferred processes include the crosslinking of material with UV light.

In some applications it is desirable to have a polymer dielectric having the same pattern as the polymer inhibitor used to pattern an ALD deposited inorganic thin film layer. In these applications, the polymer inhibitor is selected to advantageously have inhibitor properties and dielectric properties, as well as mechanical properties such that the polymer is stable in the final structure and application. When the polymer inhibitor is coated with another polymer dielectric layer it may not be necessary to modify the polymer inhibitor surface. In some embodiments, however, the polymer inhibitor is a switchable polymer inhibitor. A switchable polymer inhibitor is a polymer that as deposited, or as patterned, inhibits its ALD growth of inorganic thin films. Upon subjecting the switchable polymer inhibitor to a suitable treatment, the polymer loses its inhibition properties and the ALD is now able to nucleate on the polymer surface. Suitable treatments include high energy oxygen processes, such as oxygen plasmas and UV-ozone treatments. Preferred switchable polymer inhibitors include epoxy resins (such as SU-8), organosiloxanes (such as PDMS), and polyvinyl pyrrolidone.

A process of making the multilayer insulating structure of the present invention can be carried out below a support temperature of about 300° C., more preferably below 250° C., or even at or around 100° C. These temperatures are well below traditional integrated circuit and semiconductor processing temperatures and enable the use of any of a variety of relatively inexpensive supports, such as flexible polymeric supports. Thus, an embodiment of the invention enables production of relatively inexpensive devices on flexible substrates without the need for photolithography and enabling rapid pattern changes due to printing the patterns. An embodiment of the invention also enables production of relatively inexpensive circuits containing thin film transistors with significantly improved performance due to the control of the back channel interface and the presence of a passivation layer. Additionally, the low processing temperature required for the multilayer insulating structure reduce the potential for undesirable changes in device performance due to thermal cycling.

The substrates used in the present invention can be any material that acts as a mechanical support for the subsequently coated layers. The substrate can include a rigid material such as glass, silicon, or metals. Useful substrate materials include organic or inorganic materials. Flexible supports or substrates can be used in the present invention. Nominally rigid materials that are flexible due to their thinness may also be used. These include glass at thicknesses below 200 μm and metals at thicknesses below 500 μm.

The substrate can be bare indicating that it contains no substantial materials on its surface other the material from which it is composed. The substrate can include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, and chemical treatments.

The substrate can also include on its surface patterned materials. These patterns may include patterns that modulate light transmission or electrical conductivity within or on the substrate. The patterns may include complete devices, circuits, or active elements existing on the substrate. The patterns may include portions of devices, circuits, or active elements awaiting subsequent processing steps for completion.

The following descriptions are provided to set forth features of the present invention and serve to illustrate the key aspects of the multilayer insulating structure. The figures provided are not drawn to scale but are intended to show overall function and the structural arrangement of some embodiments of the present invention. Additionally, the invention is not limited to the embodiments shown and it should be understood that variations and modifications can be effected within the scope of the invention For bottom gate thin film transistors, it is necessary to both control the back channel interface and protect the device from environmental conditions by passivating the device. The multilayer insulating structure of the present invention as utilized in a bottom gate TFT can be better understood with respect to FIGS. 1a and 1b. FIG. 1a is a cross-sectional diagram of one embodiment of a TFT 101 of the present invention, taken along the line A-A' of the plan view shown in FIG. 1b. The TFT 101 shown in FIGS. 1a and 1b is a bottom gate structure that is representative of any bottom gate TFT 101 where the gate 120 is in contact with the substrate 110, the dielectric insulating layer 130 is in contact with the gate 120 and the substrate 110, and the inorganic semiconductor layer 150 is in contact with the source/drain 160/165. The substrate 110 can be any previously discussed substrate, and may contain a plurality of predefined layers. The gate 120 has the conventionally accepted meaning, and is used to modulate the current of the TFT 101. The electrically conductive gate layer of the gate 120 may be a single conductive material, as shown in FIG. 1a, or may include any number of conductive material layers. In useful embodiments, the inorganic semiconductor layer 150 of bottom gate transistor 101 is a metal oxide semiconductor. In useful embodiments, the metal oxide semiconductor is a ZnO based semiconductor.

In order to keep the gate 120 isolated from the semiconductor 150, the source electrode 160, and the drain electrode 165, an insulating layer 130 is disposed between the gate 120 and the semiconductor 150, the source electrode 160, and the drain electrode 165. Preferably, insulating layer 130 is a patterned inorganic thin film dielectric layer. Insulating layer 130 can be a single dielectric material, as shown in FIG. 1a, or may include any number of dielectric material layers.

The interface between the semiconductor 150 and the dielectric insulating layer 130 is critical to the function of the TFT 101. Depending upon the manufacturing methods used to make the TFT 101, this interface may or may not be easily controlled. In TFTs 101 that are formed by the combination of SAD and ALD, special care should be taken to insure that when changing between the dielectric pattern and the semiconductor pattern the interface is not disturbed by the removal of the deposition inhibiting material. As shown in FIG. 1a the inorganic semiconductor layer 150 is in direct contact with the patterned inorganic thin film dielectric insulating layer 130. In an alternative embodiment (not shown) TFT 101 can include a patterned third inorganic thin film dielectric layer, also referred to as a buffer layer, located between and in contact with the inorganic thin film dielectric layer 130 and the semiconductor layer 150. Preferably, the patterned inorganic semiconductor layer 150 has the same pattern as the buffer layer.

FIGS. 1a and 1b show the relative location of the source electrode 160 and the drain electrode 165 on substrate 110. The source and drain have conventionally accepted meanings, and the electrodes are noted as source and drain for clarity of understanding—either electrode shown may function as the source (or drain) as is required by the application or circuit. The source electrode 160 and drain electrode 165 are formed in an electrically conductive layer. The electrically conductive layer can be a single conductive material, as shown in FIG. 1a, or may comprise any number of conductive material layers.

FIGS. 1a and 1b show the multilayer insulating structure 190 which includes a polymeric structure 170 in contact with the inorganic semiconducting layer 150 and an inorganic dielectric layer 180 over the polymeric structure 170. As shown both in the cross-sectional view of FIG. 1a and the plan view of FIG. 1b, the inorganic dielectric layer 180 has the same pattern as polymeric structure 170. The multilayer insulating structure 190 functions as a passivation layer for the TFT 101.

Multilayer insulating structure 190 shown in FIGS. 1a and 1b includes a polymer structure 170 that is formed from a single polymer dielectric layer 171. In such embodiments the polymer structure 170 and the polymer layer 171 are the same, and therefore have the same pattern. As shown in FIG. 1a, the multilayer insulating structure 190 is in contact with at least the inorganic semiconductor layer 150 in the gap between the source and drain electrodes 160, 165. The gap defines the channel of the thin film transistor 101, and the multilayer insulating structure can be said to passivate the backchannel of the thin film transistor 101.

As shown, the inorganic dielectric layer 180 has a first pattern defining a first area; and the polymer structure 170 has a second pattern defining a second area. The second area is located within the first area, and the polymer structure 170 is in contact with the semiconductor layer 150 in the gap. Thin film transistor 101, having the multilayer dielectric structure 190 of the present invention is preferably an enhancement mode device.

There are a number of embodiments of the multilayer insulating structure 190 useful in the present invention that have the common elements of a polymer structure and an inorganic dielectric layer as illustrated in FIGS. 2a through 2p. In all examples, there is a patterned polymer structure 170 and a patterned inorganic thin film dielectric layer 180. The patterned polymer structure 170 has a pattern defining an area that is confined within the limits of the area of the patterned inorganic thin film dielectric layer 180, such that the edges of the patterned polymer structure 170 are aligned with or lie within the area of the patterned inorganic thin film layer 180. FIG. 2a is a cross-sectional view taken along the line A-A' of FIG. 2b. FIGS. 2a and 2b illustrate an embodiment of the multilayer insulating structure 190 that is the same as that shown in FIGS. 1a and 1b. Although shown in FIG. 2a without topology, it can be appreciated that the polymer structure 170 and inorganic thin film 180 can be used to cover features having an associated height, and therefore can have height variations (as illustrate in FIG. 1a). As shown, the first area (the area of the pattern of the polymer structure 170) is equal to the second area (the area of the pattern of the inorganic thin film dielectric layer 180).

FIG. 2c is a cross-sectional view taken along the line A-A' of FIG. 2d. FIGS. 2c and 2d illustrate an embodiment of the multilayer insulating structure 190 wherein the polymer structure 170 has at least two layers; a first patterned polymeric layer 171 having the second pattern and a second polymeric layer 175 has a third pattern that defines a third area. The third area is located with the second area defined by the second pattern layer, and the pattern of the polymer structure 170 can be said to be that of the first patterned polymer layer 171 (i.e. the second pattern). As shown in FIG. 2d, the pattern of the first polymer layer 171' is aligned with the pattern of the inorganic thin film dielectric layer 180. The pattern of the third polymer layer 175' is within the boundaries of the first patterned polymer layer 171'. FIG. 2e is a cross-sectional view taken along the line A-A' of FIG. 2f. FIGS. 2e and 2f are similar to that described in relationship to FIGS. 2a and 2b, where the multilayer insulating structure 190, includes a patterned polymer structure 170, and the inorganic thin film dielectric layer. These should be understood from the previous description. In FIGS. 2e and 2f, the first patterned polymer layer 171 has been etched back so that the first area (the area of the pattern of the inorganic thin film layer 180) extends beyond the second area (the area of the pattern 170' of the polymer structure 170) to define a reentrant profile between the inorganic dielectric layer 180 and the patterned polymeric structure 170.

FIG. 2g is a cross-sectional view taken along the line A-A' of FIG. 2h. FIGS. 2g and 2h are similar to FIGS. 2c and 2d, where the multilayer insulating structure 190 has a polymer structure 170 with at least two layers, and wherein the first patterned polymeric layer 171 has the second pattern and the second polymeric layer 175 has a third pattern that defines a third area. In FIGS. 2g and 2h, the first patterned polymer layer 171 has been etched back so that the first area (the area of the pattern of the inorganic thin film layer) extends beyond the second area (the area of the pattern 170' of the polymer structure 170) to define a reentrant profile between the inorganic dielectric layer 180 and the polymeric structure 170. FIGS. 2i through 2p are analogous to FIGS. 2a through 2h, with the added feature of another inorganic dielectric layer 185 that is conformal and extends beyond the first area. The other features of the multilayer dielectric structure 190 should be understood from the previous descriptions of FIGS. 2a through 2h.

FIG. 3 is a cross-sectional diagram of another embodiment of a bottom gate TFT 103 of the present invention. The plan view shown in FIG. 1b, is equivalent to the plan view for the TFT 103 of FIG. 3. As shown in FIG. 3, the multilayer insulating structure 190 includes a polymer structure 170 having two polymer layers. The multilayer insulating structure 190 shown in FIG. 3 is equivalent to that shown in FIGS. 2c and 2d. As shown in FIG. 3, the second polymer layer 175 is in contact with the semiconductor layer 150, and in contact with the first patterned polymer layer 171. The second polymer layer 175 preferably has the same pattern as the gap between the source and drain, and in some embodiments the second polymer layer 175 is used to pattern the source and drain electrodes 160, 165 using an ALD and SAD process. In these embodiments, the second polymer layer 175 is both a polymer dielectric and a deposition inhibitor material. In one preferred embodiment, the polymer layer 175 is polyvinylpyrrolidone. Multilayer insulating layer 190 also contains the inorganic thin film layer 180 over the patterned polymer structure 170. As shown, the first polymer layer 171 is in contact with both the second polymer layer 175 and the inorganic thin film layer 180. The patterned polymer structure 170 is not limited to two polymer layers. The patterned polymer structure 170 and the inorganic thin film layer 180 can have the same pattern, or the patterned polymer structure 170 can have a pattern such that each layer of patterned polymer structure 170 is located completely within the area of the pattern of the inorganic thin film layer 180.

Figure 4:
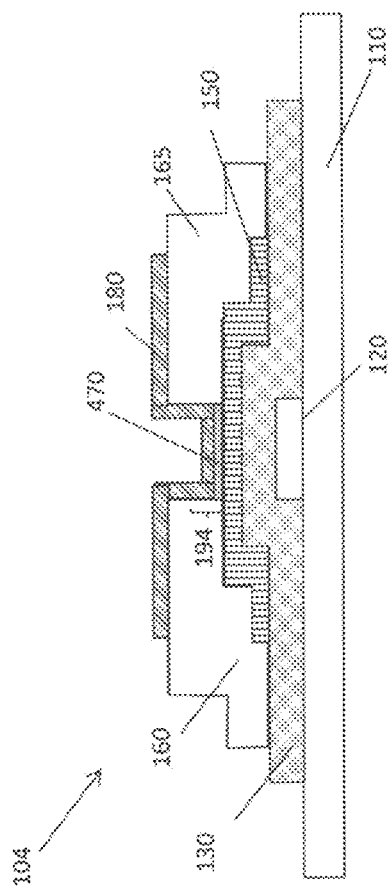
FIG. 4 is another embodiment of a multilayer insulating structure of the present invention used to passivate a bottom gate TFT.

FIG. 4 is a cross-sectional diagram of another embodiment of a bottom gate TFT 104 of the present invention. The plan view shown in FIG. 1b, is equivalent to the plan view for the TFT 104 of FIG. 4. As shown in FIG. 4, the multilayer insulating structure 194 includes a polymer structure 470 that is in contact with the semiconductor layer 150. The polymer structure 470 preferably has the same pattern as the gap between the source and drain electrodes 160, 165, and in some embodiments the polymer layer 470 was used to pattern the source and drain electrodes 160, 165 using an ALD and SAD process. In these embodiments, the polymer structure 470 is formed from a switchable polymer inhibitor which is both an insulating polymer and a deposition inhibitor material. As described above, a switchable polymer inhibitor can lose its inhibiting property after exposure, for example, to an oxygen plasma or UV-ozone process. In one preferred embodiment, the polymer structure 470 is polyvinylpyrrolidone; in other embodiments a preferred polymer for the polymer structure 470 is a novalac resin. Multilayer insulating structure 194 also contains inorganic thin film layer 180 that is over the polymer structure 470. Preferably, the inorganic thin film layer 180 is a conformal inorganic dielectric layer, preferably patterned using a combination of SALD and SAD. Using a switchable inhibitor polymer to pattern the source and drain electrodes 160, 165 using an ALD and SAD process allows for a simpler fabrication of the passivated transistor 104. There is no need to remove the inhibitor or add an additional polymer layer.

FIG. 5a is a cross-sectional diagram of one embodiment of a TFT 105 of the present invention, taken along the line A-A' of the plan view shown in FIG. 5b. TFT 105 is a bottom gate structure (as in FIG. 1a) where the gate 120 is in contact with the substrate, the insulating layer 130 is in contact with the gate 120 and the substrate 110, and the semiconductor layer 150 is in contact with the source and drain electrodes 160, 165. These layers should be understood from their descriptions with respect to FIGS. 1a and 1b.

FIGS. 5a and 5b show the multilayer insulating structure 190 which includes the patterned polymer structure 170 in contact with the semiconducting layer 150, the first inorganic dielectric layer 180 in contact with the polymeric layer 171, and the second inorganic dielectric layer 185 in contact with the first inorganic dielectric layer 180. The structure is analogous to the structures illustrated in FIGS. 2i and 2j. In alternative embodiments, the structures shown in FIGS. 2m and 2n could be used, where there is a reentrant profile between the patterned polymer structure 170 and the inorganic thin film dielectric layer 180. As shown, the patterned polymer structure 170 and the inorganic thin film layer 180 have the same pattern. The second inorganic dielectric layer 185 extends beyond the edges of the first inorganic dielectric layer 180 and of the polymer structure 170. The second inorganic dielectric layer 185 can be a different material than that of the first inorganic thin film dielectric layer 180. The second inorganic thin film dielectric layer 185 is preferably the same material as the first inorganic thin film dielectric layer 180; in these embodiments it may be difficult to detect the boundary between layers 180 and 185. The structure will instead be recognized due to the greater thickness of inorganic dielectric material located over the polymer structure 170, compared to the thickness of inorganic dielectric material not located over the polymer structure 170. The second inorganic dielectric layer 185 is preferably a conformal layer, as one would obtain from deposition using an ALD process. The second inorganic thin film dielectric layer 185 seals the edges of the polymer structure 170.

FIG. 5c is a cross-sectional diagram of a bottom gate TFT 106 of the present invention having an alternative multilayer insulating structure, taken along the line A-A' of the plan view shown in FIG. 5b. The elements in TFT 106 are the same as those in FIG. 5a, however the multilayer insulating structure 190, has two polymer layers 171, 175 that make up the patterned polymer structure 170. The structure the multilayer insulating structure 190 of FIG. 5c is analogous to the structures illustrated in FIGS. 2k and 2l. In alternative embodiments, the structures shown in FIGS. 2o and 2p could be used, where there is a reentrant profile between the patterned polymer structure 170 and the inorganic thin film dielectric layer 180. Second polymer layer 175 is preferably a polymer that is both a deposition inhibitor and an insulating material. Second polymer layer 175 should be understood from the description of second polymer layer 175 in relationship to FIG. 3, and preferably has the same pattern as the gap between the source and drain electrodes 160, 165. Similarly, in some embodiments the second polymer layer 175 was used to pattern the source and drain electrodes 160, 165 using an ALD and SAD process. In these embodiments, the second polymer layer 175 is both polymer dielectric and a deposition inhibitor material. In one preferred embodiment, the second polymer layer 175 is polyvinylpyrrolidone.

Figure 6A:
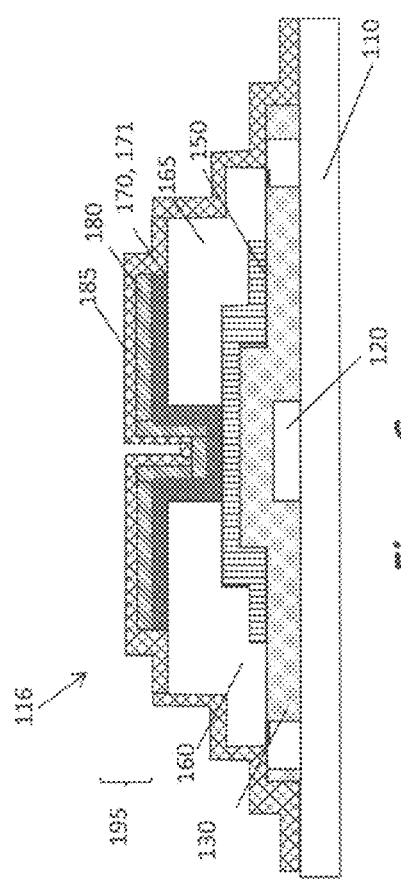
FIG. 6a is a cross-sectional view of the plan view of FIG. 6b illustrating an embodiment of the present invention having multilayer insulating structure with an inorganic insulating layer that covers an area greater than a single TFT.
Figure 6B:
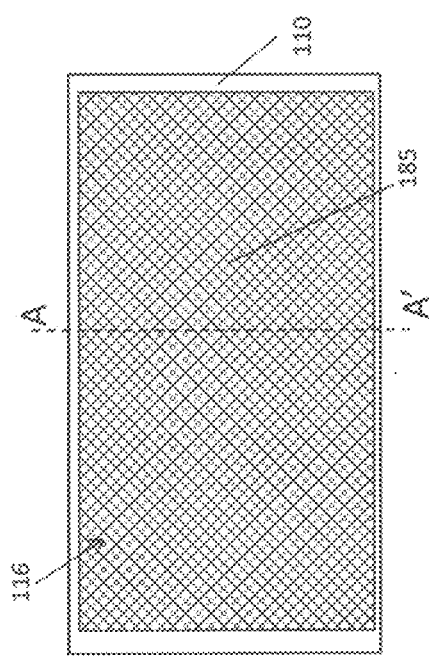

In some applications it is desirable to fully encapsulate one or more devices. FIGS. 6a and 6b illustrate embodiments in which the multilayer insulating structure 195 covers the entire area of the thin film transistor 116, and the source, drain and gate electrodes 160, 165, 120 have electrical contacts running elsewhere at the level of the substrate 110. In alternative embodiments, the polymer structure 170 and first inorganic thin film layer 180 can cover the entire area of the thin film transistor 116, however the pattern of the polymer structure 170 will still be defined by the first inorganic thin film layer 180, and in the cases where there is a second inorganic thin film layer 185 it will serve to seal the edges of the polymer layer. In still other embodiments, multiple devices can be covered with a contiguous pattern area of the multilayer insulating structure 195.

The multilayer insulating structure can be a passivating layer as described in the previous examples or it can be used as a second gate dielectric layer. FIG. 7a is a cross-sectional diagram of another embodiment of a TFT 107 of the present invention, taken along the line A-A' of the plan view shown in FIG. 7b. As shown in FIG. 7a, TFT 107 is a dual gate structure where the semiconductor channel can be gated from the top gate, the bottom gate or both. As shown, the bottom gate 120 is in contact with the substrate 110, the insulating layer 130 is in contact with the gate 120 and the substrate 110, and the inorganic semiconductor layer 150 is in contact with the source and drain electrodes 160, 165. These layers should be understood from their descriptions with respect to FIGS. 1a and 1b.

FIGS. 7a and 7b show the multilayer insulating structure 190 which includes the patterned polymer structure 170 in contact with the inorganic semiconducting layer 150 and an inorganic dielectric layer 180 in contact with the patterned polymeric structure 170. These layers should be understood from the previous discussion. In a dual gate TFT 107, the multilayer insulating layer 190 also functions as the dielectric layer for the top gate 125. The top gate 125 has the conventionally accepted meaning, and is used to modulate the current of the TFT 107. The top gate 125 can be a single conductive material, as shown in FIG. 7a, or may comprise any number of conductive material layers. Any of the previously discussed multilayer insulating structures 190 can be used in the dual-gate geometry of FIGS. 7a and 7b.

Some embodiments of the present invention relate to short channel vertical thin film transistors (VTFTs) which contain a gate structure that defines a vertical portion of the channel. The term vertical transistor as used herein refers to transistors where the source and drain which define a single channel are at two different distances from the substrate surface (as measured orthogonal to the substrate). This arrangement results in vertical transistors where at least a portion of the channel is vertically oriented with respect to the substrate, which is to say, not parallel to the top surface of the substrate. Vertical transistors of the present invention include those that have portions of their channels in an arrangement that is parallel to the substrate surface, as long as they have a portion which is not parallel. The vertical transistors of the present invention are similar to bottom gate transistors, in that they have an exposed back channel as fabricated and it is therefore desirable to both control the back channel interface and protect the device from environmental conditions by passivating the device.

A vertical transistor embodiment of the present invention includes a substrate, and an electrically conductive gate structure having a reentrant profile on the substrate. There is a conformal gate insulating layer in contact with the gate structure in the reentrant profile, and a conformal semiconductor layer in contact with the conformal gate insulating layer. The source and drain electrodes of the vertical transistor are a first electrode in contact with a first portion of the conformal semiconductor layer over the electrically conductive gate structure and a second electrode that is in contact with a second portion of the conformal semiconductor layer and separated vertically from the first electrode. The backchannel of the transistor is protected by the multilayer insulating structure which in contact with at least the conformal semiconductor layer in the reentrant profile. The multilayer insulating structure includes an inorganic dielectric layer and a polymer structure that is in contact with the conformal semiconductor layer in the reentrant profile. The multilayer insulating structure of the present invention as utilized in a vertical TFT can be better understood with respect to the following description.

Embodiments of the vertical transistors of the present invention are formed using a gate structure. As used herein, the gate structure can be any structure which has a reentrant profile. The gate structure can be uniform in material composition, or be formed of multiple materials. The gate structure can also be referred to as a post, as long as the post has the required reentrant profile. The gate structure can be formed using a post and cap, where the cap extends beyond the wall of the post to define the reentrant profile. The gate structure can be formed from any material, including both conductive and insulating materials. The electrically conductive gate structure, as used herein, refers to the structure which contains the conductive material which will be used to gate the vertical transistor channel. The electrically conductive gate structure is at least conductive on the surface within the reentrant profile. In some embodiments, the electrically conductive gate structure includes a gate structure with an electrically conductive gate layer.

Returning to the Figures, a schematic cross-sectional view of vertical transistors 108 and 208 of the present invention is shown FIG. 8a, taken along the line A-A' of the plan view shown in FIG. 8b.

As shown in FIG. 8a, TFT 108 and TFT 208 each have a vertical transistor structure, where the vertical portion is defined by the first reentrant profile 840 and second reentrant profile 845 of the electrically conductive gate structure 820 respectively. The insulating layer 850 is in contact with the electrically conductive gate structure 820 and the substrate 810, and the semiconductor layer 860 is in contact with the insulating layer 850 and the first electrode 870, the second electrode 875, and the third electrode 880. As shown, the first electrode 870 and the second electrode 875 are located adjacent to the first and second reentrant profiles 840, 845, respectively. The first electrode 870 and the second electrode 875 are vertically spaced from the third electrode 880 due to the height of the electrically conductive gate structure 820. The third electrode 880 is in conformal contact with a third portion of the semiconductor layer on the top of the electrically conductive gate structure, the first electrode 870 and the third electrode 880 defining ends of a first channel of a first transistor 800, the second electrode 875 and the third electrode 880 defining ends of a second channel of a second transistor 208.

Vertical transistors 108 and 208 are connected in series and formed over a single gate structure. For simplicity, the following description will relate to vertical transistor 108 with the understanding that the descriptions apply equally to vertical transistor 208. Vertical transistor 108 includes a substrate 810. Substrate 810, often referred to as a support, can be rigid or flexible and should be understood from the previous descriptions. As shown, the electrically conductive gate structure 820 is on the substrate, and extends away from the substrate to a top. The electrically conductive gate structure includes a first edge including a first reentrant profile 840 and a second edge located opposite the first edge and including a second reentrant profile 845.

The electrically conductive gate structure 820 can contain both conductor and insulating materials, the only requirement being that the electrically conductive gate structure 820 has conductive material on vertical side walls of the reentrant profile 840. The electrically conductive gate structure 820 can be fully formed of conductive materials, such as metals and conductive oxides. To better understand the requirements for the electrically conductive gate structure 820, we will turn briefly to FIGS. 9a through 9c.

As shown in FIGS. 9a, 9b and 9c the electrically conductive gate structure 820 can have any shape which has a height dimension 730a, 730b, 730c extending away from the substrate to a top 735a, 735b, 735c. The electrically conductive gate structure 820 also has edges along the height dimension, a first edge 710a, 710b, 710c including a first reentrant profile 840a, 840b, 840c and a second edge 720a, 720b, 720c opposite the first edge 710a, 710b, 710c and including a second reentrant profile 845a, 845b, 845c. The electrically conductive gate structure 820 has a width at the top 700a, 700b, 700c, and a minimum width 705a, 705b, 705c between the top and the substrate that is smaller than the width of the top. The reentrant profile is defined as the profile of the electrically conductive gate structure 820 that lies within the boundaries of the top of the electrically conductive gate structure 820, the substrate 810, and a line drawn orthogonal to the substrate from the edge of the top (as shown by lines P-P' in FIGS. 9a, 9b and 9c). To aid in understanding, the first reentrant profile 840a, 840b, and 840c in each figure is shown in bold. Additionally, the electrically conductive gate structure 820 can have portions that extend beyond the reentrant profile, as shown in FIG. 9c. The electrically conductive gate structure 820 shown in these figures can be fully formed of conductive materials, or in alternative embodiments the electrically conductive gate structure 820 structures may have an insulating core with an electrically conductive conformal gate layer coating. FIGS. 9a, 9b and 9c illustrate reentrant profiles obtainable with either an electrically conductive core or insulating structural polymer core. It should be recognized that the first and second reentrant profiles shown in FIGS. 9a, 9b and 9c (840a, 840b, 840c and 845a, 845b, and 845c) are equivalent to the first and second reentrant profiles 840 and 845 of FIG. 8a.

Returning now to FIGS. 8a and 8b, the vertical transistors 108 and 208 also include an electrically insulating material layer 850 and a conformal semiconductor material layer 860. The conformal electrically insulating layer 850 maintains the reentrant profiles 840 and is in contact with the electrically conductive gate structure 820 and at least a portion of the substrate 810. The insulating material layer 850 conforms to the reentrant profiles 840, 845 of the electrically conductive gate structure 820 in transistors 108 and 208. Insulating material layer 850 can coat the reentrant profiles 840, 845 of the electrically conductive gate structure 820 and a portion of the substrate 810. The conformal electrically insulating layer 850 preferably has a uniform thickness. Insulating material layer 850 is often referred to as a dielectric material layer, and as a gate insulator. Insulating material layer 850 includes first and second surfaces with the first surface being in contact with portions of surfaces of electrically conductive gate structure 820 and substrate 810. Insulating layer 850 is at least within the reentrant profile 840.

Semiconductor material layer 860 conforms to reentrant profile 840 of the electrically conductive gate structure 820. As shown, the conformal semiconductor layer 860 maintains the first and second reentrant profiles 840 and is in contact with the conformal electrically insulating layer 850. Semiconductor layer 860 includes first and second surfaces with the first surface being in contact with the second surface of insulating layer 850. The conformal semiconductor layer 860 preferably has a uniform thickness. The semiconductor layer 860 is at least within reentrant profiles 840. Preferably, the conformal semiconductor layer 860 is an inorganic semiconductor layer, preferably a metal oxide semiconductor.

The first electrode 870, second electrode 875 and the third electrode 880 are formed simultaneously in a common step and have the same material composition and layer thickness. The first electrode 870 is in contact with a first portion of the semiconductor layer 860 and is located adjacent to the first reentrant profile 840. The second electrode 875 is in contact with a second portion of the semiconductor layer 860 and located adjacent to the second reentrant profile 845. The third electrode 880 is in contact with a third portion of the semiconductor layer 860 on the top of the electrically conductive gate structure 820. The first electrode 870 and the third electrode 880 define ends of a first channel of a first transistor, and the second electrode 875 and the third electrode 880 define ends of a second channel of a second transistor.

As shown, the electrically conductive gate structure 820 functions as the gate for transistors 108 and 208. In some example embodiments of transistor 108, first electrode 870 functions as the drain of transistor 108 and third electrode 880 functions as the source of transistor 108. In other example embodiments of transistor 108, first electrode 870 functions as the source and third electrode 880 functions as the drain. The semiconductor device is actuated in the following manner. After transistor 108 is provided, a voltage is applied between the first electrode 870 and the third electrode 880. A voltage is also applied to the electrically conductive gate structure 820 to electrically connect the electrode 870 and the third electrode 880.

Still referring to FIGS. 8a and 8b, vertical transistor 208 is formed at the same time as vertical transistor 108 is formed. Transistor 208 can be actuated in the following manner. A voltage is applied between the first electrode 875 and the third electrode 880, which is shared with vertical transistor 108. A voltage is applied to the conductive gate structure 820, which is shared with vertical transistor 108, to electrically connect the electrode 875 and 880.

Alternatively, transistor 108 and transistor 208 can be actuated in series by applying a voltage between first electrode 870 and second electrode 875. A voltage is applied to the conductive gate structure 820, which simultaneously electrically connects first electrode 870 to third electrode 880 and connects third electrode 880 to second electrode 875. This can be advantageous for circuit applications because external electrical connections do not need to be made to the elevated third electrode 880.

The reentrant profile 840 of transistor 108 allows a dimension of the semiconductor material channel of the transistor to be associated with the thickness (or height) of the electrically conductive gate structure 820, which functions as the gate, of transistor 108. Advantageously, this architecture of the present invention reduces reliance on high resolution or very fine alignment features during the manufacture of transistors that include short channels. Furthermore, the separation of the first electrode 870 and third electrode 880 is primarily determined by the reentrant profile 840 in the electrically conductive gate structure 820.

Referring back to FIGS. 9a through 9c, the precise geometry of the electrically conductive gate structure 820 can vary as long as it meets the requirements of having a height dimension extending away from the substrate 810 to a top, edges along the height dimension where a first edge includes a first reentrant profile 840 and a second edge opposite the first edge includes a second reentrant profile 845. The electrically conductive gate structure 820 is only required to be conductive along the first 840 and second 845 reentrant profiles. However, in some embodiments the electrically conductive gate structure 820 is formed from only conductive materials, and is fully conductive. In other embodiments, the electrically conductive gate structure 820 is formed using a polymer post, optionally with an inorganic cap, that is conformally coated by an electrically conductive gate layer. It should be clear that all of the structures of FIGS. 9a through 9c could be used in place of the electrically conductive gate structure 820 shown in FIGS. 8a and 8c, and are to be considered to be embodiments of the present invention. As such, the example embodiments of this invention should be understood to work with any electrically conductive gate structure 820 which meets the requirements as defined herein, and is not limited to the ones illustrated.

The vertical transistor structure illustrated in FIGS. 8a and 8b was used to form two vertical transistors, 108 and 208, connected in series. It should be understood that similar structures can be used to form single vertical transistors, or two independently operable transistors, see, for example, co-assigned pending U.S. patent application Ser. Nos. 14/198,631; 14/198,623; 14/198,643; 14/198,633; 14/198,682; 14/198,628; 14/198,658; 14/198,647, all filed Mar. 6, 2014. The multilayer insulating structure 890 can be used in any of these alternate vertical transistor geometries which use a gate structure having a reentrant profile.

FIGS. 8a and 8b show the multilayer insulating layer 890 which includes a polymeric structure 178 in contact with the inorganic semiconducting layer 850 and an inorganic dielectric layer 188 in contact with the polymeric structure 178. As shown, the polymeric structure 178 can have a single layer of insulating polymer 179. The inorganic dielectric layer 188 preferably has the same pattern as polymer structure 178. The multilayer insulating layer 890 can have any number of polymer layers and inorganic materials layers, as long as it meets the requirement that a passivating polymer layer 179 of the polymer structure 178 is in contact with the inorganic semiconductor layer 850 and there is an inorganic layer 188 in contact with the polymer structure 178. Preferably, the inorganic layer 188 has the same pattern as the polymer structure 178. As shown in FIG. 8a, the polymeric layer 178 preferably fills reentrant profile 840.

Figure 10:
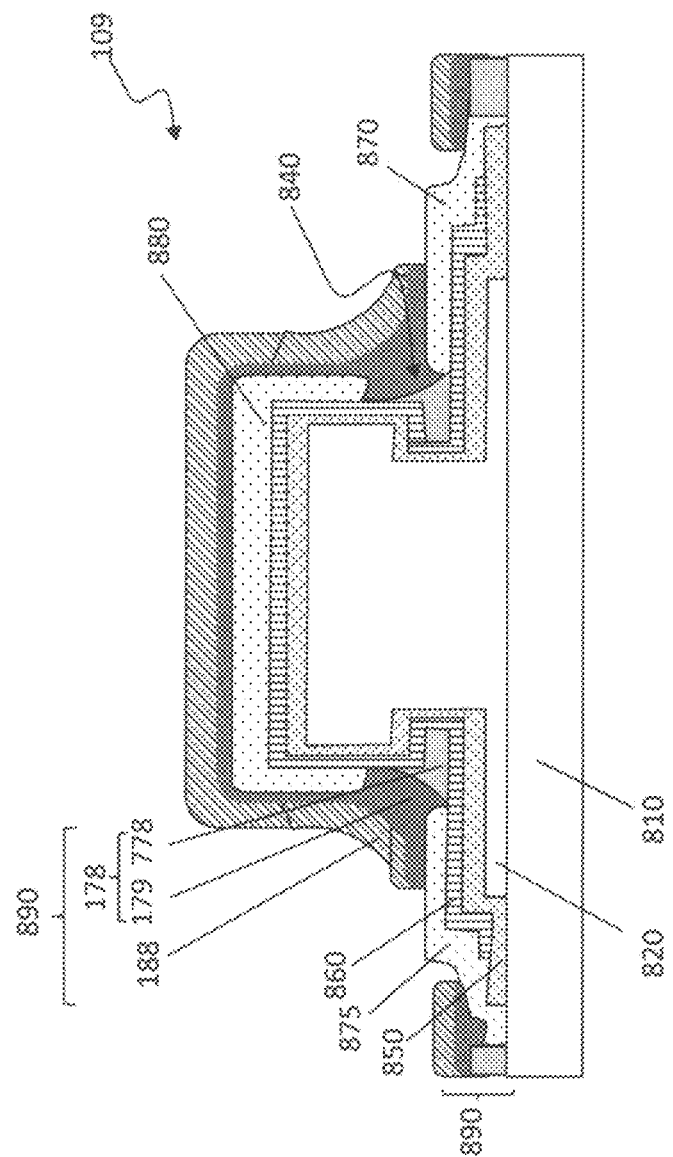
FIG. 10 is another embodiment of a multilayer insulating structure of the present invention having two polymer layers used to passivate a vertical TFT.

The multilayer insulating structure 890 is equivalent to the previously described multilayer structure 190. Any of the multilayer insulating structures described in relationship to FIGS. 2a though 2o are useful in vertical transistor structures. The multilayer insulating structure 890 can have any pattern as long as it covers the back channel of the vertical transistor. As shown in FIG. 8a, the multilayer insulating structure 890 can be in contact with a portion of the first electrode 870 and a portion of the second electrode 875. As illustrated in FIGS. 2e and 2f, the multilayer insulating structure 890 can have a polymer layer with an edge and the inorganic dielectric layer 188 can extend beyond the edge of the polymeric layer. In some embodiments, the inorganic dielectric layer 188 extends beyond the edge of the polymer layer to define another reentrant profile between the inorganic dielectric layer 188 and the patterned polymeric structure 170 (also shown in FIGS. 2e and 2f). FIGS. 10, 11 and 12 illustrate alternative embodiments of vertical transistors having a multilayer insulating structure; these Figures should serve to aid the understanding of the integration of the multilayer insulating structures of FIGS. 2a through 2o in vertical transistors.

As shown in FIG. 10, the multilayer insulating layer 890 has a polymer structure 178 having two polymer layers. The vertical TFT 109 has a multilayer insulating structure 890 with two polymer layers 179, 778 and one inorganic dielectric layer 188. The second polymer layer 778 is in contact with the semiconductor 860 in the channel and in contact with polymer layer 179. Polymer layer 179 of the polymer structure 178 is in contact with inorganic dielectric layer 188. This is the structure which would result from using the polymer 778 as an inhibitor when forming the source and drain electrodes using an ALD and SAD process, and as such the second polymer layer 778 preferably has the same pattern as the gap between the source and drain. In these embodiments, the polymer layer 778 is both polymer dielectric and a deposition inhibitor material. In one preferred embodiment, the polymer layer 778 is polyvinylpyrrolidone.

After forming the source and drain electrodes 860, 865, the polymer layer 179 is then deposited over the inhibitor polymer 778 and optionally cured. Next a patterned inorganic layer 188 is deposited over the polymer structure 178, and the patterned inorganic layer 188 is used as a hard mask to pattern polymer structure 178 using an etching process. This results in a structure, as shown, where the polymer structure 178 (and polymer layer 179) has the same pattern as the patterned inorganic layer. This embodiment of the multilayer insulating structure 890 is equivalent to that shown in FIGS. 2c and 2d. Depending on the etch conditions, the edges of the polymer layer 179 can be aligned to the edges of the inorganic layer (as shown), or there can be a reentrant profile where there edges of the polymer layer are inset from the edges of the inorganic layer (as illustrated in FIGS. 2e and 2f).

FIG. 11 illustrates another embodiment of the present invention. The vertical TFT 111 has a multilayer insulating structure with a single polymer layer 179 and two inorganic dielectric layers 188 and 189. As shown, the vertical TFT 111 is the result of adding an additional inorganic layer to vertical TFT 108 of FIG. 8a. The second inorganic layer 189 covers both the first inorganic layer 188 and the polymer layer 179 and serves to seal the edges of the polymer layer 179. The inorganic layer 189 can be a different dielectric material than inorganic layer 188. Preferably, inorganic layer 189 is the same material as inorganic layer 188. When layer 189 and 188 are the same material, it may be difficult to detect the boundary between the layers. In this structure, it will be clear because there will be a greater thickness of inorganic dielectric material over the polymer layer 179, than is found not over the polymer structure 178. The inorganic dielectric layer 189 is preferably a conformal layer, as one would obtain from deposition using an ALD process. Vertical transistor 111, has a polymer layer 179 having an edge, with a second conformal inorganic dielectric layer 189 that extends beyond the edge of the polymer layer 179 and the inorganic dielectric layer 188 to seal the edge of the polymeric layer. The multilayer insulating shown in FIG. 11 is equivalent to that shown in FIGS. 2i and 2j, where the polymer layer 179 (polymer structure 178) has the same pattern as the first inorganic thin film layer 188. Alternatively, the multilayer insulating structure 890 illustrated in FIGS. 2m and 2n could be used, where the pattern of the first inorganic dielectric layer is larger than that of the polymer structure.

FIG. 12 illustrates an embodiment of the present invention. The vertical TFT 112 has a multilayer insulating structure with two polymer layers and two inorganic dielectric layers. As shown, the vertical TFT 112 is the result of adding an additional inorganic layer 189 to vertical TFT 109 of FIG. 10. The structure of FIG. 12 should be understood with respect to the descriptions of FIGS. 10 and 11. Vertical transistor 112 has a polymer structure 178 with first and second polymeric layers 179, 778 having edges, with a conformal inorganic dielectric layer 189 that extends beyond the edges of the first and second polymeric layers 179, 778 and the inorganic dielectric layer 188 to seal the edge of the polymer structure. The multilayer insulating structure 890 shown in FIG. 12 is equivalent to the multilayer insulating structure 190 shown in FIGS. 2k and 2l. Alternatively, the multilayer insulating structure illustrated in FIGS. 2o and 2p could be used, where the pattern of the first inorganic dielectric layer 188 is larger than that of the polymer structure 170. The multilayer insulating structures 890 of the present invention preferably cover the majority of the substrate area, and can preferably be patterned with vias allowing contact to the source, drain and gate electrodes 860, 865, 820. Alternatively, the multilayer insulating structure 890 having two or more inorganic layers can be formed so that the top-most inorganic layer is unpatterned over a large region of the substrate 810, and the electrical connections to the VTFT electrodes are made by connections running at the substrate level.

Some embodiments of the present invention relate to top-gate thin film transistors (TFTs) which, as previously described, have a semiconductor layer that is between the substrate and the gate layer. Unlike bottom gate TFTs, top gate TFTs are inherently protected from the environment since the semiconductor layer is between the substrate and the gate dielectric. The challenge in forming enhancement mode top gate devices is in controlling the back channel interface, where the semiconductor would typically contact the substrate. When forming top gate TFTs on some substrates, including inorganic substrates, the back-channel interface properties can cause the device to operate in the less desirable depletion mode. The present invention utilizes a patterned polymer layer between the inorganic semiconductor and the substrate to control the interface. In some embodiments the polymer layer can be formed to have the same pattern as the inorganic semiconductor layer, or the polymer layer can be formed such that the polymer layer is under the inorganic semiconductor layer in the gap and not under the source and drain electrodes. This method allows the back-channel of the device to have an interface with a specified material, instead of defaulting to an interface with the substrate.

FIG. 13a is a cross-sectional diagram of a top gate TFT 500, taken along the line A-A' of the plan view shown in FIG. 13b. The TFT 500 shown in FIGS. 13a and 13b is a top-gate structure that is representative of any top gate TFT 500 where a polymer layer 570 is in contact with a substrate 510, the source/drain 560 is in contact with the polymer layer 570, the semiconductor layer 550 is in contact with the source/drain 560, the polymer layer 570 and the insulating layer 530, and the insulating layer 530 is in contact with the gate 520.

As shown in FIG. 13b, on substrate 510, there is a polymer layer 570. The substrate 510 can be any previously discussed substrate, and may contain a plurality of predefined layers. The substrate 510 is preferably an inorganic substrate. Polymer layer 570 can be any structural polymer that modifies the charge of the semiconductor back channel, including SU-8, novalac resin and polyimide based materials. Polymer layer 570 can be a uniform coating over the entire substrate or patterned. Alternatively, the polymer layer 570 could be self-supporting and serve as both polymer layer 570 and substrate 510. In contact with polymer layer 570 are source/drain electrodes 560, 565. The source and drain have conventionally accepted meanings, and either electrode shown may be designated the source (or drain) as is required by the application or circuit. The source/drain 560 can be a single conductive material, as shown in FIG. 13a, or may comprise any number of conductive material layers. The gap between the source/drain electrodes 560/565 defines the channel of TFT 500, as is conventionally understood. The inorganic semiconductor layer 550 is in contact with both the source/drain 560/565 and the substrate 510, as shown in FIG. 13a. The inorganic semiconductor layer 550 can be a metal oxide, for example a ZnO-based material.

The insulator layer 530 is in contact with the source/drain electrodes 560/565 and the inorganic semiconductor layer 550. Insulating layer 530 is preferably patterned to enable electrical contact to the source/drain electrode 560/565. Insulating layer 530 is often referred to as a dielectric material layer, and can be formed of a single dielectric material layer or multiple dielectric material layers. Preferably the insulating layer 530 is a thin film inorganic dielectric material layer.

Gate layer 520 is over the gap between the source/drain electrodes 560/565, and in contact with insulating layer 530. The gate layer 520 has the conventionally accepted meaning, and is used to gate the current of the TFT 500. The gate layer 520 may be a single conductive material, as shown in FIG. 13a, or may comprise any number of conductive material layers.

Although a uniform layer of polymer on the substrate 510 can be useful to control the charge on the back channel of the semiconductor layer 550, it can be difficult to integrate a uniform polymer layer into a circuit design. In many circuits there are conductive traces running at the level of the substrate 510 that have to connect to the electrodes of the thin film transistor 500. This requires that the polymer layer 570 that is used to control the charge on the back channel be patterned. It is preferable that the pattern of the polymer layer 570 be constricted to be within the pattern of the semiconductor so that it does not negatively impact any process steps required to integrate the TFTs into various circuit designs. Therefore, preferred top-gate transistors of the present invention have a substrate and a polymer layer 575 that is in contact with the substrate 510. The polymer layer 575 has a first pattern defining a first area. Over the polymer layer 575 is an inorganic semiconductor layer 550 that is in contact with the polymer layer, and has a second pattern defining a second area. The first area of the polymer layer 575 is located within the second area of the inorganic semiconductor layer 550. A source electrode 560 is in contact with a first portion of the semiconductor layer 550, and a drain electrode 565 in contact with a second portion of the semiconductor layer 550, the source electrode and the drain electrode separated by a gap defining the channel of the transistor. There is a gate insulating layer 530 in contact with the inorganic semiconductor layer 550 in the gap and a gate in contact with the gate insulating layer 530 over the gap which is used to gate the current of the transistor 500. It is preferred that the inorganic semiconductor is a metal oxide semiconductor, and preferably the metal oxide semiconductor is a ZnO based semiconductor. The substrate is preferably an inorganic substrate such as glass.

FIG. 14a is a cross-sectional diagram of a top-gate embodiment of a TFT 505 of the present invention, taken along the line A-A' of the plan view shown in FIG. 14b. The TFT 505 shown in FIGS. 14a and 14b is a top gate structure that is representative of a top gate TFT 505 in which a patterned polymer layer 575 is in contact with the inorganic semiconductor layer 550 on the side opposite the gate 520, where the polymer layer 575 has the same pattern as the inorganic semiconductor layer 550. As shown, the polymer layer 575 has a first pattern whose area is equal to the second area of the inorganic semiconductor layer 530. The area of the polymer pattern can be equal to or less than that of the pattern of the semiconductor layer 530, and thereby meet the requirement that the first area of the polymer layer 575 is located within the second area of the inorganic semiconductor layer 550. In some embodiments, the process of patterning the polymer layer 575 may result in a pattern that is smaller than that of the semiconductor layer 550, due to edge effects from etching or developing. In these embodiments, it is preferred that the amount of over etch is controlled such that the first area of the polymer layer 575 is at least 90% of the second area of the semiconductor layer 550, more preferably such that the first area is at least 95% of the second area.

In the top-gate architecture of TFT 505, the source/drain electrodes 560/565 are in contact with the substrate 510 and the semiconductor layer 550, and the insulating layer 530 is in contact with the semiconductor layer 550, the source/drain 560, and the gate 520, and these layers should be well understood from the previous description of FIGS. 13a and 13b. In the top gate TFT 505, at least a portion of each of the source electrode 560 and the drain electrode 565 are over at least a portion of the polymer layer 575 and the semiconductor layer 550. The polymer layer 575 in FIGS. 14a and 14b modifies the semiconductor back channel interface. In the embodiment shown in FIG. 14a, the polymer layer 575 is patterned in the same pattern as the semiconductor layer 550. This structure can be obtained by first coating a uniform polymer layer on the substrate 510. Next, a patterned inorganic semiconductor layer 550 is deposited, preferably using a combination of ALD and SAD processes. The patterned inorganic semiconductor layer 550 is then used as a hard mask to etch the uniform polymer layer. The remainder of the device is formed using any process known in the art. This method of using the patterned inorganic semiconductor layer 550 to mask the patterning of polymer layer 530 allows for precise control of the pattern of the polymer layer 575.

In alternate embodiments, the semiconductor layer 550 can extend beyond the edges the polymer layer with a pattern that is different from the pattern of the polymer layer, so long as the semiconductor layer 550 is in contact with the polymer layer in the area defined by the gap in the source/drain electrodes. The top gate TFT 515 shown in FIG. 15*a*, a cross-sectional diagram of along the line A-A' of the plan view shown in FIG. 15*b*, is illustrative of using a switchable polymer inhibitor to control the back channel. The polymer layer 578 is a patterned switchable inhibiting polymer layer that was used to pattern the source and drain electrodes. After patterning the source and drain electrodes 560, 565, patterned switchable inhibiting polymer layer 578 was treated to enable growth on the polymer surface. The inorganic semiconductor layer 550 is then deposited over the top of the treated insulating polymer layer 578. In preferred embodiments, the inorganic semiconductor layer 550 is patterned at the time of deposition using the combination of the SAD and ALD processes. The same polymer material as in layer 578 can be used as the deposition inhibitor for patterning the semiconductor layer 550, as long as it is deposited after the step of treating the polymer layer 578. This use of the patterned inhibitor 578 that was used to form the source and drain electrodes eliminates a process step when forming enhancement mode top gate TFTs with a polymer back channel protection layer. As shown in FIGS. 15*a* and 15*b*, polymer layer 578 has a pattern having a first area that is smaller than the second area of the semiconductor layer 550. In this embodiment, the first pattern of the polymer layer 578 defines the gap that separates the source electrode 560 and the drain electrode 565. Since the polymer layer 578 was used to pattern the source and drain electrodes 560, 565, the source electrode 560 and the drain electrode 565 are not over the polymer layer 578.

The multilayer insulating structures for bottom-gate and vertical transistors discussed above are preferably formed by the uniform deposition of a structural polymer, followed by the formation of a patterned inorganic dielectric layer, followed by pattern-wise etching the structural polymer. Preferably, this process uses the combination of SAD and ALD process to form the patterned inorganic dielectric layer as described in co-assigned pending U.S. application Ser. No. 14/198,626, filed Mar. 6, 2014. In some embodiments, the polymer that is in contact with the back channel of the semiconductor layer was also used as a deposition inhibitor. The ability to switch the polymer properties between inhibiting and not inhibiting enables the formation of structures with polymers as a permanent element. The use of polymer inhibitors materials that can be switched removes process steps in device fabrication. Where desirable, the polymer can be left in place and an inhibitor removal step is no longer required. In some embodiments, the step of depositing and patterning a passivating polymer can be removed since the switchable deposition inhibitor can perform as the desired passivation layer. One embodiment of a process of the present invention is outline in FIG. 16 in a diagrammatic Step diagram for making a patterned polymer layer using a combination of selected area deposition (SAD) and ALD where the polymer inhibitor remains in the final structure.

Figure 16:
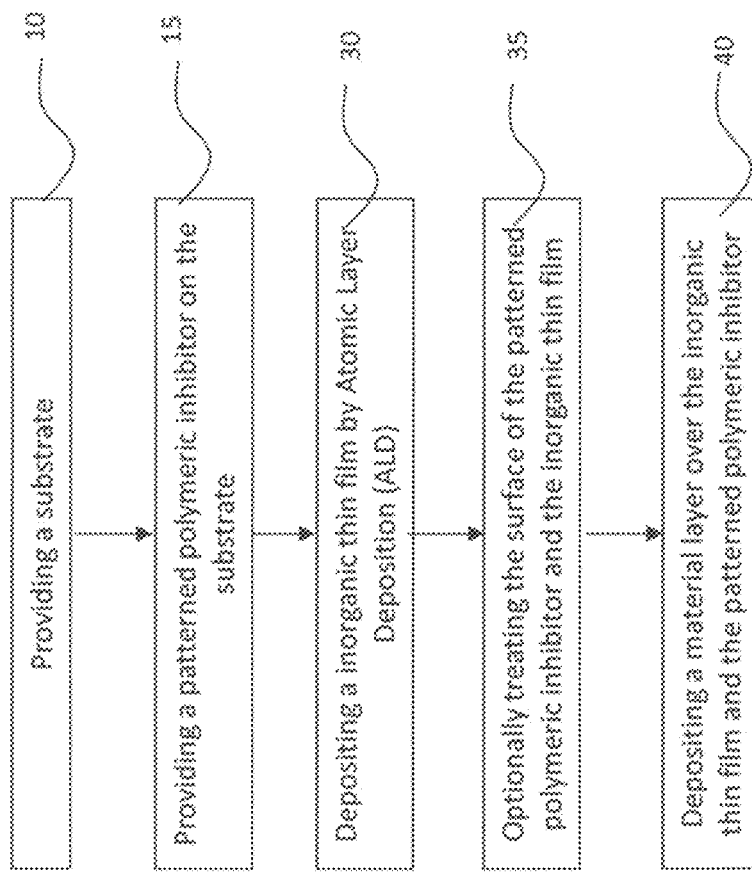
FIG. 16 is a flow chart describing the steps of one embodiment of the present process for forming a patterned polymer structure.

As shown in FIG. 16, in Step 10 a substrate is provided. The substrate may be any substrate as discussed that is suitable for use in the ALD system, and can contain any number of pre-existing features and material layers. In Step 15 a patterned polymeric inhibitor layer is provided on the substrate. The polymeric inhibitor material can be any polymer material that both causes the ALD material deposition to be inhibited and is desired to remain in the final structure. Useful polymers include those that are stable under device conditions. Epoxy resins, novalac resins, and polyvinyl pyrrolidone are preferred polymer inhibitor materials. The patterned polymeric inhibitor layer is preferably printed, in a patterned manner, using a printing means such as using inkjet, flexography, gravure printing, microcontact printing, offset lithography, patch coating, screen printing, or transfer from a donor sheet. Alternatively, the patterned polymeric inhibitor layer can be uniformly deposited and patterned using photolithography. The surface of the substrate can be optionally treated prior to printing the patterned inhibitor material layer in Step 15.

In step 30, an inorganic thin film layer is deposited by ALD. The patterned polymeric inhibitor layer inhibits the deposition of the inorganic thin film material so that the inorganic material only deposits on the areas on the substrate where the inhibitor is not present. Preferably, there is no measurable deposition of the inorganic material on the areas of the substrate where the inhibitor is present. As such, the inorganic thin film layer has the inverse pattern to that of the patterned inhibitor layer. Generally, this deposition can be done using any ALD system, preferably a spatial ALD system. The inorganic thin film layer can be any material that can be deposited via ALD and whose growth is inhibited by the inhibitor layer. The inorganic thin film layer can be any thickness so long as it has the properties necessary in the final application. Preferred thickness of the inorganic thin film layer is between 5 nm and 100 nm, with thicknesses of less than 25 nm being suitable for many applications. The inorganic thin film layer is preferably a metal oxide, or a doped metal oxide. A particularly useful material for applications requiring a dielectric layer is $Al_2O_3$. ZnO is another preferred material in applications requiring semiconductor layer; AZO (aluminum-doped zinc oxide) is a preferred material in applications requiring a conductive layer. The result of Step 30 is a patterned inorganic thin film.

In Step 35, the surface of the patterned polymeric inhibitor layer is optionally treated. The treatment can occur locally, however preferred treatment methods act uniformly on the substrate surface including the patterned polymeric inhibitor layer and the patterned inorganic thin film layer. The treatment can be understood from the previous discussion and can include using UV-ozone or oxygen plasma processes. The optional treatment in Step 35 is necessary when using an ALD process to over coat the polymeric inhibitor layer. In processes where the polymeric inhibitor layer is covered by another polymer layer the optional treatment may not be required.

In step 40, a material layer is deposited over the patterned inorganic thin film and the patterned polymeric inhibitor. The material layer can be an inorganic layer or a polymeric layer. When the material layer is an inorganic layer it is preferred that the deposition is done using an ALD process. When depositing another inorganic thin film using ALD, a selective area deposition process can be used to pattern the thin film during the atomic layer deposition process. In these embodiments, prior to depositing the material layer in Step 30, another patterned layer of deposition inhibitor can be provided so that the material layer is patterned as deposited using the combination of SAD and ALD processes. When the material layer deposited in Step 30 is a polymeric layer it is preferred that the polymer layer is a structural polymer. A structural polymer is any polymer that is desired to remain in the final structure and should be understood from the previous descriptions. In some embodiments, Step 30 includes depositing a polymeric thin film. In other embodiments, Step 30 deposits a polymer film using a coating or printing process. The material layer in Step 30 can only cover a portion of the substrate as long as it covers at least a portion of both the patterned polymeric inhibitor layer and the patterned inorganic thin film layer.

The process flow described in FIG. 16 can be better understood through the descriptive process build shown in FIGS.

Figure 17A:
FIGS. 17a through 17d are cross-sectional side views of the steps of one embodiment of the present process for forming a patterned multilayer insulating structure.
Figure 17B:
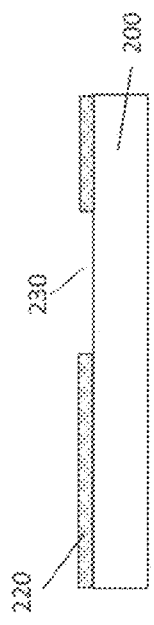

17a through 17e. In FIG. 17a, the substrate 200 is provided as in Step 10 of FIG. 16. FIG. 17b illustrates the patterned inhibitor layer 220 which is provided on the surface of the substrate 200 in Step 15 of FIG. 16. Preferably, the patterned inhibitor layer 220 is a printed patterned inhibitor layer. As discussed above, the surface of the substrate 200 can be treated prior to printing the patterned inhibitor material layer 220. Patterned inhibitor layer 220 contains regions 230 where the inhibitor material is not present.

Figure 17C:
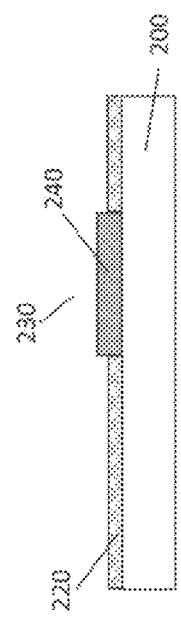
Figure 17D:
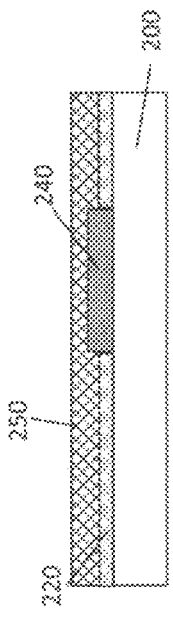

FIG. 17c shows the patterned inorganic thin film material 240 after the substrate surface has been exposed to an ALD coating process such that the inorganic thin film material is only deposited in the regions 230 where the inhibitor material is not present (Step 30 of FIG. 16). FIG. 17d illustrates the resultant structure after depositing material layer 250 on the patterned inorganic thin film and patterned inhibitor layer 220. This process is particularly useful for forming multilayer insulating structures. As discussed in the specific transistor embodiments above, the material layer 250 can be a dielectric material layer when forming a multilayer insulating structure. In embodiments where the material layer 250 is a polymeric dielectric, it is preferred that the material layer 250 is deposited using a coating process or printing process. In embodiments where the material layer is an inorganic material layer it is preferred that the deposition be done using a chemical vapor deposition process, preferably an ALD process. It should be understood from the previous descriptions this method is useful in forming the patterned polymer interface control layer useful in top gate embodiments of the present invention. In these embodiments, the material layer 250 is a semiconductor layer and the patterned inorganic thin film material 240 is an electrically conductive material (with the appropriately chosen pattern for the patterned inhibitor layer 220).

EXAMPLES

General Conditions for the Preparation of Layers Using Atmospheric Pressure ALD

Figure 18:
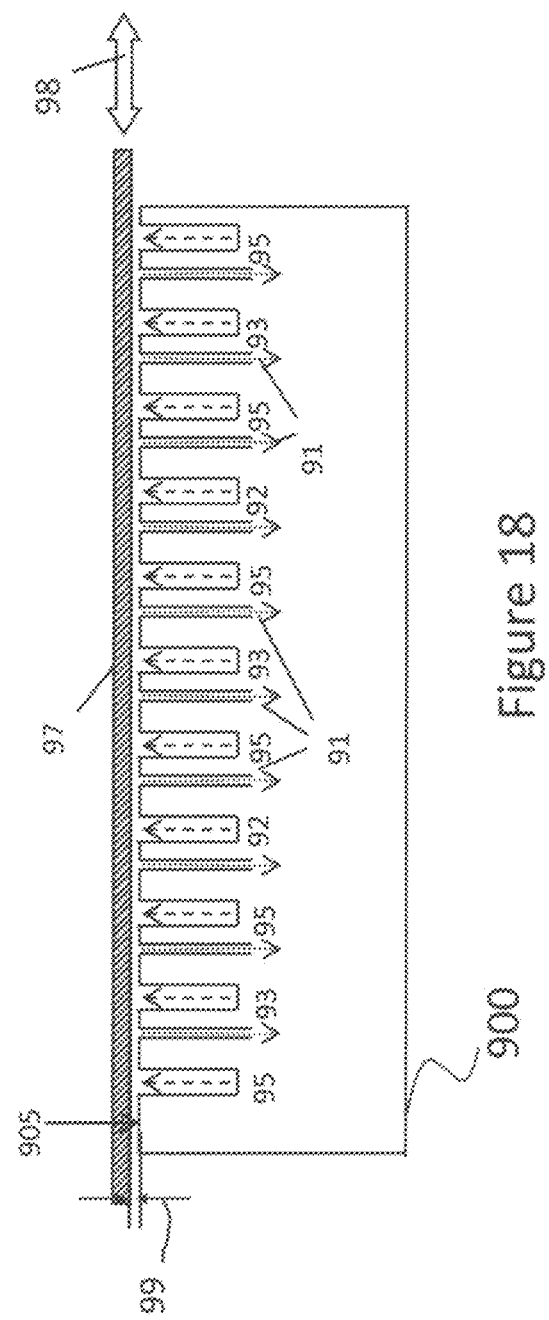
FIG. 18 is a cross-sectional side view of a deposition device used for thin film deposition in the Examples.

The preparation of a thin film coating of the material layers on glass substrates as used in the examples is described below. The ALD coating device used to prepare these layers, namely aluminum oxide, ZnO:N, and Al-doped ZnO (AZO), has been described in detail in US Patent Application Publication No. US 2009/0130858, the disclosure of which is herein incorporated by reference in its entirety. The coating device has an output face (facing up) that contains spatially separated elongated gas channels and operates on a gas bearing principle. The coating device can be understood with respect to delivery head 900 shown in FIG. 18. Each gas channel is composed of an output slot 95, 93, 92 which supplies gas to the output face 85, and adjacent exhaust slots 91 which remove gas from the output face 905. The order of the gas channels is P-O-P-M-P-O-P-M-P-O-P where P represents a purge channel, O represents a channel containing an oxygen based precursor, and M represents a channel containing a metal based precursor. As a substrate moves relative to the coating head it sees the above sequence of gases which results in ALD deposition.

A 2.5×2.5 inch square (62.5 mm square) glass substrate attached to a heated backer is positioned above the output face of the coating device and is maintained in close proximity to the output face by an equilibrium between the pull of gravity, the flow of the gases supplied to the output face, and a slight amount of vacuum produced at the exhaust slot. For all of the examples, the exhaust slot pressure was approximately 40 inches of water below atmospheric pressure. The purge gas P is composed of pure nitrogen. The oxygen reactive precursor O is a mixture of nitrogen, water vapor, and optionally ammonia vapor. The metal reactive precursor M is one or a mixture of active metal alkyls vapor in nitrogen.

The metal alkyl precursors used in these examples were dimethylaluminum isopropoxide (DMAI) and diethyl zinc (DEZ). The flow rate of the active metal alkyl vapor was controlled by bubbling nitrogen through the pure liquid precursor contained in an airtight bubbler by means of individual mass flow control meters. This saturated stream of metal alkyl was mixed with a dilution flow before being supplied to the coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through a mass flow controller and mixing with the water vapor stream. All bubblers were held at room temperature. The temperature of the coating was established by controlling heating of both the coating device and the backer to a desired temperature. Experimentally, the flow rates of the individual gasses were adjusted to the settings shown in Table 1 for each of the material layers coated in the examples contained herein. The flows shown are the total flows supplied to the coating device, and thus are partitioned equally among the individual gas channels.

The coating process was then initiated by oscillating the substrate across the coating head for the number of cycles necessary to obtain a uniform deposited film of the desired thickness for the given example. The coating head as described above contains two full ALD cycles (two oxygen and two metal exposures per single direction pass over the head), therefore a round trip oscillation represents 4 ALD cycles. All samples were coated at a substrate temperature of 200° C.

TABLE 1

| Layer | DMAI flow (sccm) | DEZ flow (sccm) | NH3 flow (sccm) | Water flow (sccm) | TMA flow (sccm) | $N_2$ dilution with Metal Alkyl (sccm) | $N_2$ dilution with water (sccm) | $N_2$ Inert Purge (sccm) | Residence Time (ms) |
|---|---|---|---|---|---|---|---|---|---|
| $Al_2O_3$ | 65 | 0 | 0 | 65 | 0 | 1500 | 2250 | 3000 | 50 |
| ZnO:N | 0 | 60 | 4 | 45 | 0 | 1500 | 2250 | 3000 | 50 |
| AZO | 10 | 30 | 0 | 22.5 | 0 | 1500 | 2250 | 3000 | 50 |

Bottom Gate TFT Experiments to Probe the Effect of Passivation

In order to probe the impact of the multilayer insulating structure on transistor performance and stability, bottom-gate TFTs were built using the spatial atomic layer deposition tool described above. The Example TFTs were fabricated as described below, and the relative differences between the samples are called out in the following descriptions for clarity. Electrical testing of the transistors was accomplished by using a probe station to contact the gate and source/drain electrodes. The transistors were swept in the linear regime, with the drain being held constant at 0.2V (Vd=0.2), and the gate voltage was swept over the range indicated. The mobility (Mob), threshold voltage (Vth), drain current at maximum gate bias (Ion), the current flowing at Vg=0, and average gate leakage current at the maximum gate voltage applied (Ig (Vgmax)) were extracted from the measurements taken. One aspect of the invention relates to stable enhancement mode transistors, so it is desirable that the Ion be high, and the current flowing when there is no bias on the gate (Vg=0) be as low as possible. It is further desired that the performance of the transistor remains unchanged under bias stress.

Comparative Example C1

Bottom Gate TFT with PVP Deposition Inhibitor Passivation on a Glass Substrate

Comparative Example C1 is a bottom-gate device having a simple polymer in contact with the backchannel of the TFT. Comparative Example C1 was fabricated using the combination of spatial ALD and selective area deposition (SAD). The gate layer was 1000 Å of AZO, the gate dielectric was 500 Å of $Al_2O_3$, 200 Å of ZnO:N was used for the semiconductor layer and 1000 Å AZO was used for the source and drain electrodes. The printed inhibitor used to pattern each of the device layers was a 2 wt % polyvinyl pyrrolidone (PVP) k30 in diacetone alcohol solution which was printed using a Dimatix 2500 printer. The pattern of PVP used to pattern the AZO layer in to the source and drain was left on the device during testing, such that the back channel of the semiconductor layer was covered by a thin layer of PVP k30. The transistor dimensions were W=400 microns, and L=95 microns. The extracted performance values for Comparative Example C1 can be found in Table 2.

Comparative Example C2

Bottom Gate TFT with no Passivation on a Glass Substrate

Comparative Example C2 is a bottom gate TFT which had all materials that were in contact with the semiconductor back channel removed. Comparative Example C2 was fabricated like Comparative Example C1 using the combination of spatial ALD and selective area deposition (SAD), and was formed from the same material stack and transistor geometry. The PVP pattern used to pattern the AZO layer in to the source and drain was removed from the device using a 100 W 0.3 Torr oxygen plasma, in a Technics PEIIA parallel plate system. Prior to removing the PVP from the back channel, the behavior of Comparative Example C2 measured and found to be similar to that of Comparative Example C1. However, removing the polymer from the back channel caused the transistor behavior to change, with a negative shift in Vth of 3.6 volts. The characteristic performance parameters for Comparative Example C2 can be found in Table 2.

Comparative Example C3

Bottom Gate TFT with Al2O3 Passivation on a Glass Substrate

Comparative Example C3 was fabricated as Comparative Example C2 with the following exceptions. After removing the PVP used to pattern the source and drain electrodes, a 750 Å thick aluminum oxide passivation layer was deposited using the SALD equipment described above with 2312 ALD cycles and DMAI as the precursor. The passivation layer was patterned using a PVP k30 printed inhibitor in order to provide access to the source, drain and gate electrodes for electrical testing. The deposition of alumina on the back channel resulted in a transistor with a negative threshold voltage. The characteristic performance parameters for Comparative Example C3 can be found in Table 2; a visualization of the performance can be gained from the Id-Vg curve shown in FIG. 20.

Inventive Example I1

Bottom Gate TFT with only SU-8+Al2O3 Passivation on a Glass Substrate

Inventive Example I1 is a bottom-gate transistor that was passivated with a multilayer dielectric stack of the present invention. Inventive Example I1 was fabricated as Comparative Example C2 with the following exceptions. After removing the PVP used to pattern the source and drain electrodes, the transistor was passivated using a multilayer dielectric stack of the present invention. The multilayer dielectric stack was formed by spinning on a 10% solution of SU-8 2010 in PGMEA. The SU-8 was blanket exposed and cured at 225° C., resulting in a cured layer of SU-8 with a nominal thickness of 1000 Å. After curing the SU-8, the surface was treated with a 30 second 100 W 0.3 Torr oxygen plasma to enable the growth of $Al_2O_3$ on the SU-8 surface. A 2% solution of PVP k30 was printed on the SU-8 surface to define the pattern for the inorganic layer of the multilayer insulating structure. The sample was then coated with 250 Å of $Al_2O_3$ using the SALD system described above with DMAI as the precursor at 200° C.; the PVP inhibited the growth such that $Al_2O_3$ was only deposited in the areas of the SU-8 that did not have PVP. The SU-8 was then patterned using a 2 minute oxygen plasma at 300 W and 0.4 Torr, which removed the PVP inhibitor and the SU-8 that was not protected by the patterned $Al_2O_3$, resulting in a polymer structure with pattern having an area that lies within the pattern of the inorganic layer. The transistors were then characterized as for the Comparative Examples, and the performance data for Inventive Example I1 can be found in Table 2; a visualization of the performance can be gained from the Id-Vg curve shown in FIG. 20.

TABLE 2

| Sample | Passivation Layer | N TFT | Mob | Vth | Von | Ion (Vg = 14 V) | Ioff (Vg = 0 V) |
|---|---|---|---|---|---|---|---|
| C1 | PVP k30 | 19 | 17.22 (1.41) | 5.51 (1.07) | −0.71 (0.65) | 1.53E−5 (1.61e−6) | 1.51E−9 |
| C2 | None | 1 | 21.45 | 2.60 | −5.83 | 2.9E−5 | 4.18E−7 |
| C3 | Al2O3 | 29 | 21.15 (1.66) | −0.98 (0.49) | −4.88 | 3.65E−5 | 3.48E−6 |
| I1 | SU-8/Al2O3 | 70 | 17.22 (2.27) | 2.91 (0.85) | −0.61 (0.59) | 2.26E−5 | 4.61E−10 |

As can be seen in Table 2, removing the polymer from the backchannel in Comparative Examples C2 causes the threshold voltage to shift around −3 volts, while shifting the turn-on voltage by −5 V resulting in a poor sub-threshold slope. When the polymer used to pattern the source and drain electrode was removed and the back channel was passivated with only $Al_2O_3$, both the turn-on and the threshold voltage are negative resulting in a depletion mode TFT as seen by the data for Comparative Example C3. The negative threshold voltage shift associated with inorganic passivation causes the TFT to be fully on at 0 V, making it ineffective as a switch when applying a positive voltage bias. If instead, after removing the polymer used to pattern the source and drain electrode, the back channel is passivated with the multilayer insulating structure of the present invention, there is a shift in the threshold voltage with no change in the turn-on voltage resulting in the more desirable enhancement mode TFT as seen in the data for Inventive Example I1.

Figure 19:
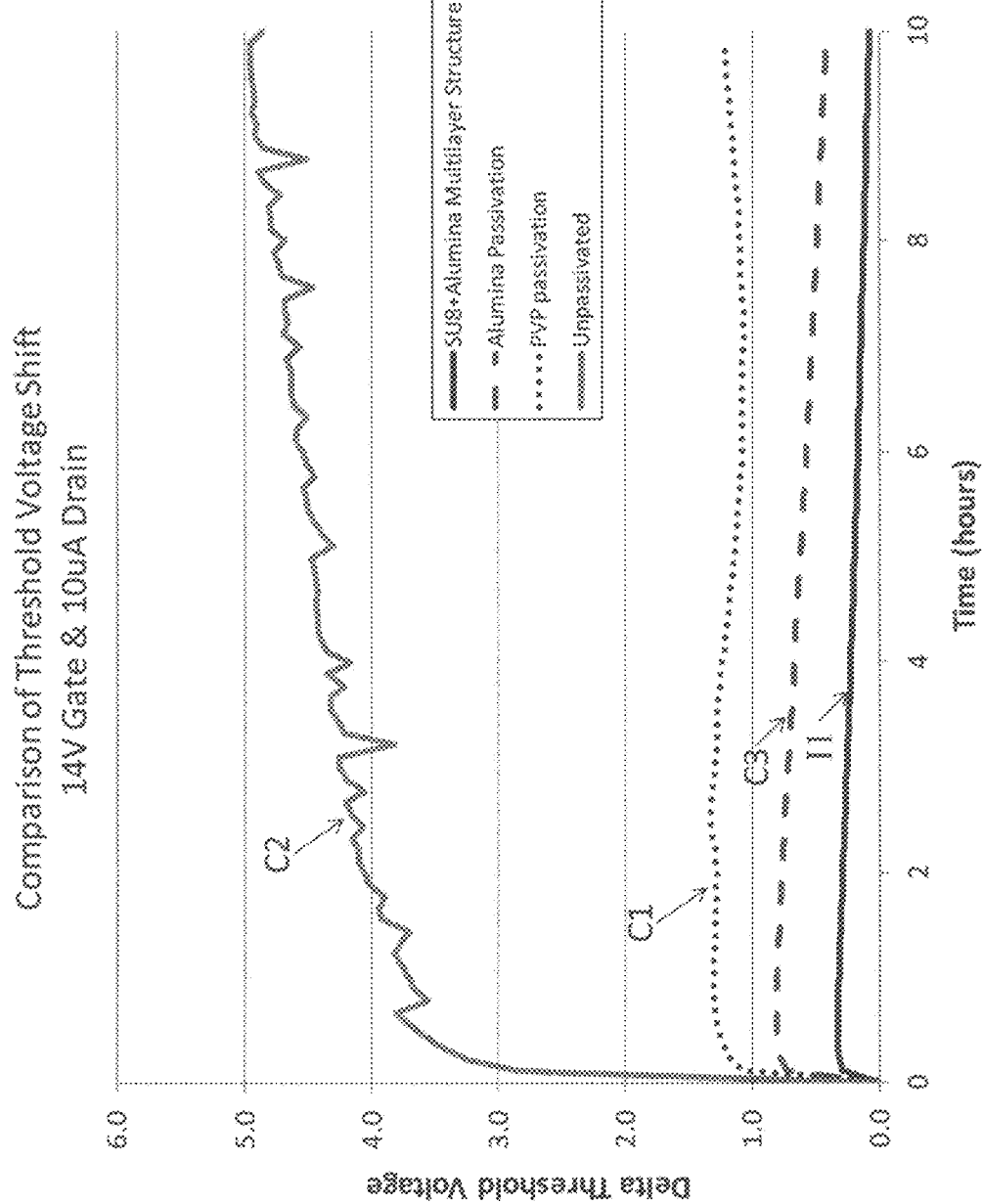
FIG. 19 is a graph showing the change in threshold voltage with bias stress for Comparative Examples C1, C2, and C3 and Inventive Example I1.

These samples were then evaluated for stability under stress. For comparison, each sample was operated at a constant drain current of 10 uA with a constant gate voltage of 14 V. Each sample was held under constant stress, which was periodically stopped (every 400 seconds) and then the device was swept in the linear regime with Vd=0.2 V. The transistor performance after 10 hours of stress can be found in Table 3, and the change in threshold voltage as a function of stress time is shown in FIG. 19.

TABLE 3

| Sample | Passivation Layer | Mob | Vth | Von | Ion (Vg = 14 V) | Ioff (Vg = 0 V) | Delta Vth | Id/Io |
|---|---|---|---|---|---|---|---|---|
| C1 | PVP k30 | 14.46 | 6.98 | 0.87 | 1.25E−05 | 1.41E−10 | 1.22 | 0.88 |
| C2 | None | 23.63 | 7.46 | −6.33 | 1.89E−05 | 9.52E−08 | 4.86 | 0.65 |
| C3 | Al2O3 | 20.24 | −0.42 | −5.35 | 3.5E−05 | 2.98E−06 | 0.41 | 0.98 |
| I1 | SU-8/Al2O3 | 18.13 | 4.22 | −0.08 | 2.19E−05 | 2.31E−09 | 0.08 | 1.01 |

Figure 20:
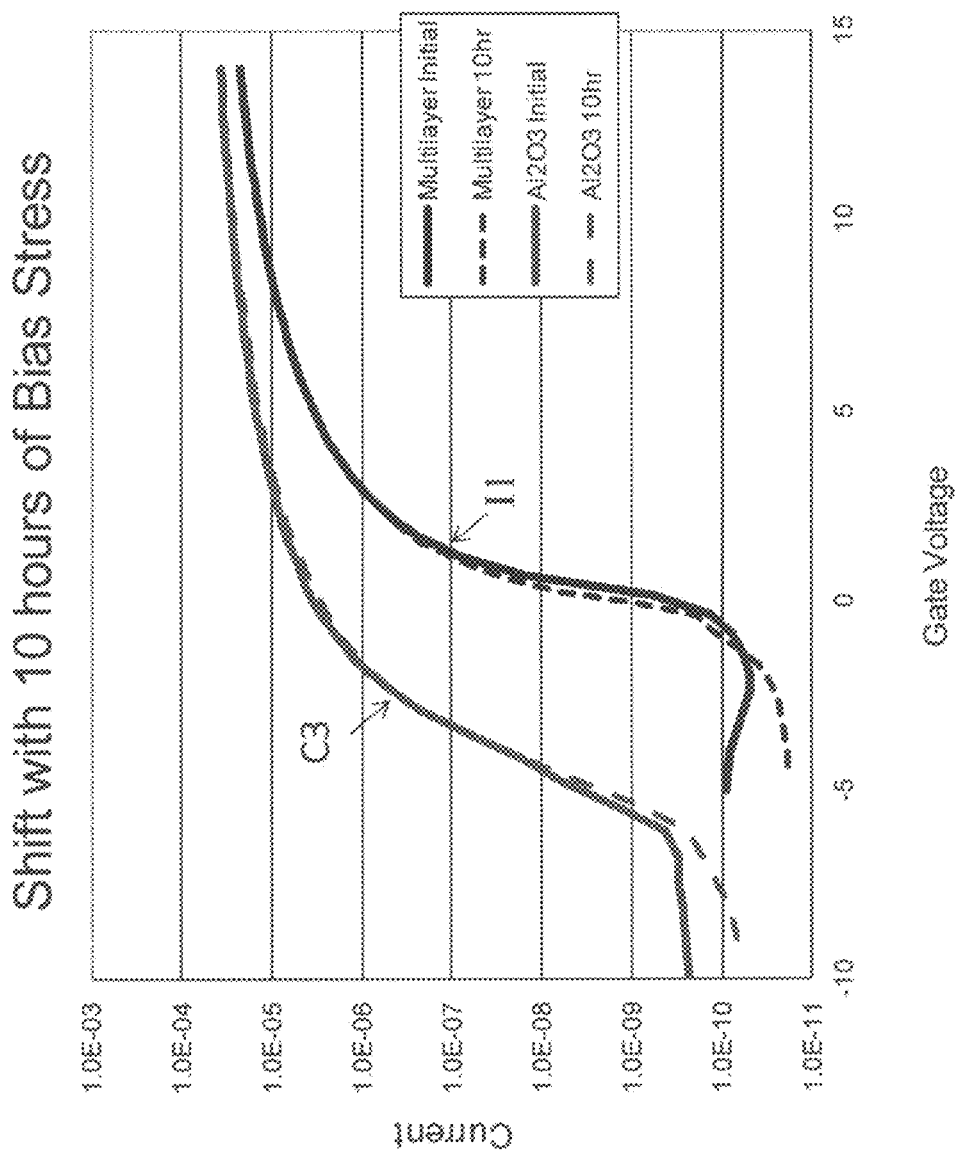
FIG. 20 is a graph showing performance $I_{ds}$-$V_g$ curve characteristics from the transistors of Comparative Example C3 and Inventive Example I1 as measured with $V_d$=0.2 Volt.

As seen in Table 3, Inventive Example I1 had the smallest threshold voltage shift, and thus performed the best, under bias testing. Comparative example C2, which had an unprotected back channel had a large threshold voltage shift with only 10 hours of bias testing, as well as a decreased Ion current and a higher-than-desirable off current (Vg=0). Comparative example C1 with only PVP on the backchannel performed better than comparative example C2. However, PVP is not an environmental barrier, so is insufficient as a final passivation and barrier layer. Comparative Example C3 with only alumina passivation was stable under stress, however the device is always on and is not an enhancement mode transistor. In comparison, Inventive Example I1 had stable on current, a stable threshold voltage and stable turn-on voltage position, indicating that the device is a stable enhancement mode device. FIG. 20 clearly illustrates the difference in performance between Inventive Example I1, an enhancement mode device and Comparative Example C3, a depletion mode device.

Vertical TFT Experiments to Probe the Effect on the Back Channel Surface

In order to probe the impact of the multilayer insulating structure on transistor performance and stability, vertical TFTs were fabricated. Electrical testing of the vertical transistors was accomplished by using a probe station to contact the gate and source/drain electrodes, and the data was evaluated in the same manner as with the bottom gate transistors.

Inventive Example I2

Vertical TFT with only SU-8+Al2O3 Passivation on a Glass Substrate

Inventive Example I2 is a vertical transistor that was passivated with a multilayer dielectric stack of the present invention. The transistor was fabricated using the combination of spatial ALD and selective area deposition (SAD). The gate structure was formed by coating 6000 Å layer of cured SU-8 by spinning a 33.5% solution of SU-8 2010 in PGMEA at 3000 rpm, blanket exposing, and baking with a final hard bake for 5 minutes at 225° C. A hard mask of $Al_2O_3$ was patterned using selective area deposition with an inkjet printed PVP inhibitor mask. The gate structure was completed by etching the PVP and SU-8 for 6 minutes in a 300 W, 0.4 Torr oxygen plasma to form a reentrant profile, and then uniformly coating with 250 Å of $Al_2O_3$. A gate layer of 1000 Å AZO was deposited over the gate structure, the gate dielectric was 400 Å of $Al_2O_3$, the semiconductor layer was 200 Å of ZnO:N, and the source and drain electrodes were 1000 Å of AZO. The inhibitor used to pattern each of the device layers was a 2 wt % PVP in diacetone alcohol solution, which was printed with a Fuji Dimatix printer. The transistor dimensions were W=254 microns, with an approximate length L=17 microns. The PVP pattern used to pattern the AZO layer in to the source and drain was left on the device during initial characterization, such that the back channel of the semiconductor layer was covered by a thin layer of PVP k30. After characterization, the PVP was removed from the semiconductor surface using a 2 minute 100 W, 0.3 Torr oxygen plasma.

Next, the sample was passivated by forming the multilayer dielectric stack. The multilayer dielectric stack was formed by spinning on a 33.5% solution of SU-8 2010 in PGMEA. The SU-8 was blanket exposed and final cured at 225 C, resulting in a cured layer of SU-8 with a nominal thickness of 6000 A, with the SU-8 filling the reentrant profile of the vertical transistor. After curing the SU-8, the surface was treated with a 30 second 100 W 0.3 Torr oxygen plasma to enable the growth of $Al_2O_3$ on the SU-8 surface. A 2% solution of PVP was printed on the SU-8 surface to define the passivation pattern. The sample was then coated at 200° C. with 250 Å of $Al_2O_3$ using the SALD system described above with DMAI as the precursor; the PVP inhibits the growth such that $Al_2O_3$ was only deposited in the areas of the SU-8 that did not have PVP. The SU-8 was then patterned using a 6 minute oxygen plasma at 300 W and 0.4 Torr, which removed the PVP inhibitor and the SU-8 that was not protected by the patterned $Al_2O_3$. The transistors on the sample were then characterized in the same manner as the original sample, and showed no threshold voltage shift after passivation. The initial value and the change with passivation for a representative transistor for Inventive Example I2 can be found in Table 4, as well as in FIG. 21.

Inventive Example I3

Vertical TFT PVP+SU-8+Al2O3 Passivation on a Glass Substrate

Figure 22:
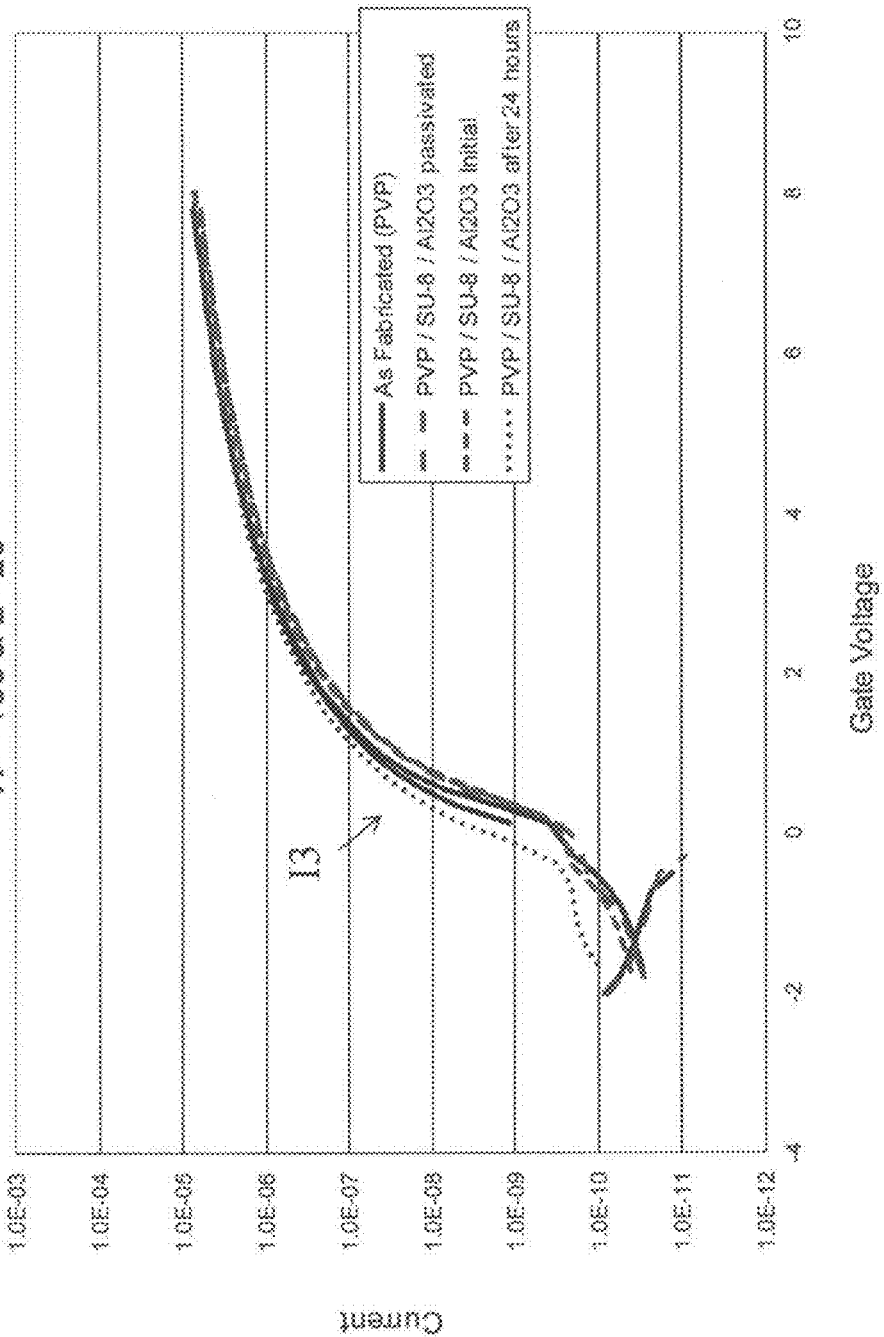
FIG. 22 is a graph showing performance $I_{ds}$-$V_g$ curve characteristics from a transistor of Inventive Example I3 as measured with $V_d$=0.2 Volt.

Inventive Example I3 is vertical transistor that was passivated with an alternative multilayer dielectric stack of the present invention. Inventive Example I3 was fabricated and tested using the same process steps as Inventive Example I2, with the following exception. After initial characterization of Inventive Example I3, the PVP inhibitor was not removed—instead the PVP was left in place and coated with the 6000 Å of SU-8 during the passivation process. As such, the multilayer dielectric stack of Inventive Example I3 includes the PVP (which was originally used as the deposition inhibitor for patterning the source and drain), the SU-8, and $Al_2O_3$. The data from the characterization testing for a representative transistor, including the initial values and the change with passivation for Inventive Example I3 can be found in Table 4, as well as in FIG. 22.

TABLE 4

| Sample | Passivation Layer | Channel Width | Channel Len | N TFT | Before Passivation Initial Mob | Before Passivation Initial Vth | After Passivation After Mob | After Passivation After Vth |
|---|---|---|---|---|---|---|---|---|
| I2 | SU-8/Al2O3 | 254 | 17 | 48 | 14.4 | 3.4 | 8.9 | 2.9 |
| I3 | PVP SU-8/Al2O3 | 185 | 28 | 60 | 8.7 | 3.7 | 68 | 3.7 |

The VTFTs had no statistical shift in threshold voltage after passivation, although there was a small decrease in both the mobility and the on current calculated from a linear gate voltage sweep (Vd=0.2). This response to passivation was independent of channel length and width, and was similar for both I2 and I3 illustrating that both embodiments of the multilayer dielectric structure maintain the original transistor performance. To evaluate the effectiveness of the multilayer dielectric stack as a passivation layer for devices under stress, representative transistors each from Inventive Examples I2 and I3 were operated at a constant current of 10 uA. Each sample was held under stress for 24 hours with a gate voltage of 8 V with a drain current of 10 uA. Periodically, every 400 seconds, the transistor was swept in the linear regime, with the gate voltage swept from −2 to 8 V and Vd held at 0.2 V. The results of this testing can be found in Table 5.

TABLE 5

| Sample | Passivation Layer | Channel Width | Channel Len | Initial Vth | Io | Delta Vth | Id/Io |
|---|---|---|---|---|---|---|---|
| I2 | SU-8/Al2O3 | 254 | 17 | 3.3 | 2.0E−05 | −0.70 | 0.80 |
| I3 | PVP SU-8/Al2O3 | 185 | 28 | 3.6 | 7.0E−06 | −0.42 | 1.03 |

Figure 21:
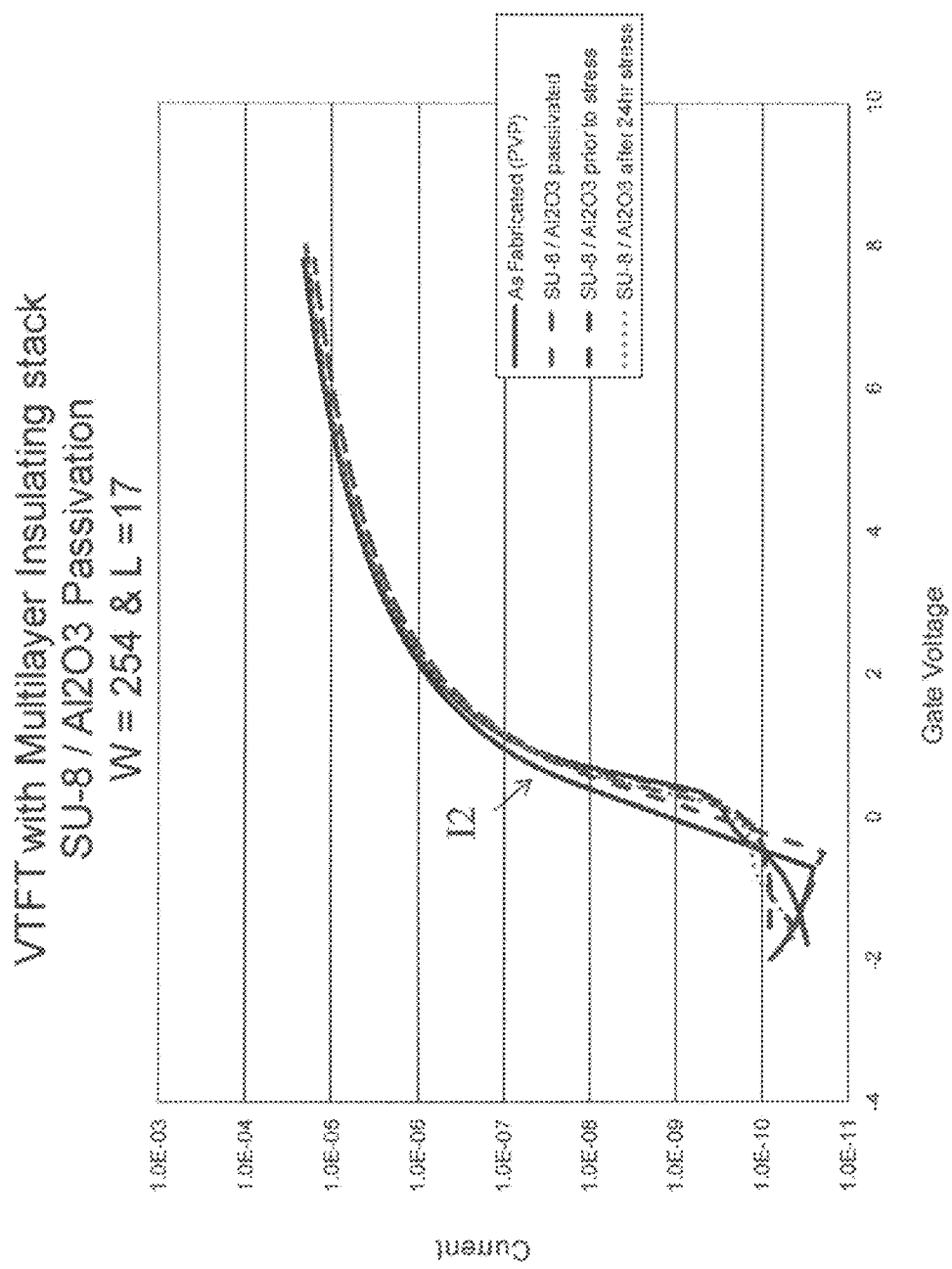
FIG. 21 is a graph showing performance $I_{ds}$-$V_g$ curve characteristics from a transistor of Inventive Example I2 as measured with $V_d$=0.2 Volt.

As can be seen from Table 5, inventive examples I2 and I3 had stable on current values and threshold voltage position. FIG. 21 has the data for four linear sweeps for Inventive Example I2 that are nearly identical; these measurements were taken after fabrication (before passivation), after passivating with the multilayer insulating structure, after passivation and immediately before applying the stress conditions, and after 24 hours of constant current stress. Similarly, FIG. 22 has the data for four linear sweeps for Inventive Example I3 that are nearly identical; these measurements were taken after fabrication (before passivation), after passivating with the multilayer insulating structure, after passivation and immediately before applying the stress conditions, and after 24 hours of constant current stress. It is clear from the data in Table 5 and FIGS. 21 and 22 that the multilayer insulting structure is an effective passivation layer for the vertical transistor geometry.

Top-Gate TFT Experiments to Probe the Effect Back Channel Surface

In order to probe the impact of the using a polymer charge-control layer on the back channel of a top gate TFT, a number of top-gate devices were fabricated. Electrical testing of the top-gate transistors was accomplished by using a probe station to contact the gate and source/drain electrodes, and the data was evaluated in the same manner as with the bottom-gate transistors. The transistors were swept in the linear regime, with the drain being held constant at 0.2 V (Vd=0.2), and in the saturation regime, with the drain being held constant at 15V or 20 V depending on the device. The mobility (Mob), threshold voltage (Vth), and the turn-on voltage (gate voltage for 1 nA of drain current, Von) were extracted from the measurements taken. One aspect of the invention relates to stable enhancement mode transistors, so it is desirable that the Ion be high, Vth be positive, and Von be close to zero.

Comparative Example C4

Top Gate TFT on a Glass Substrate

Figure 23:
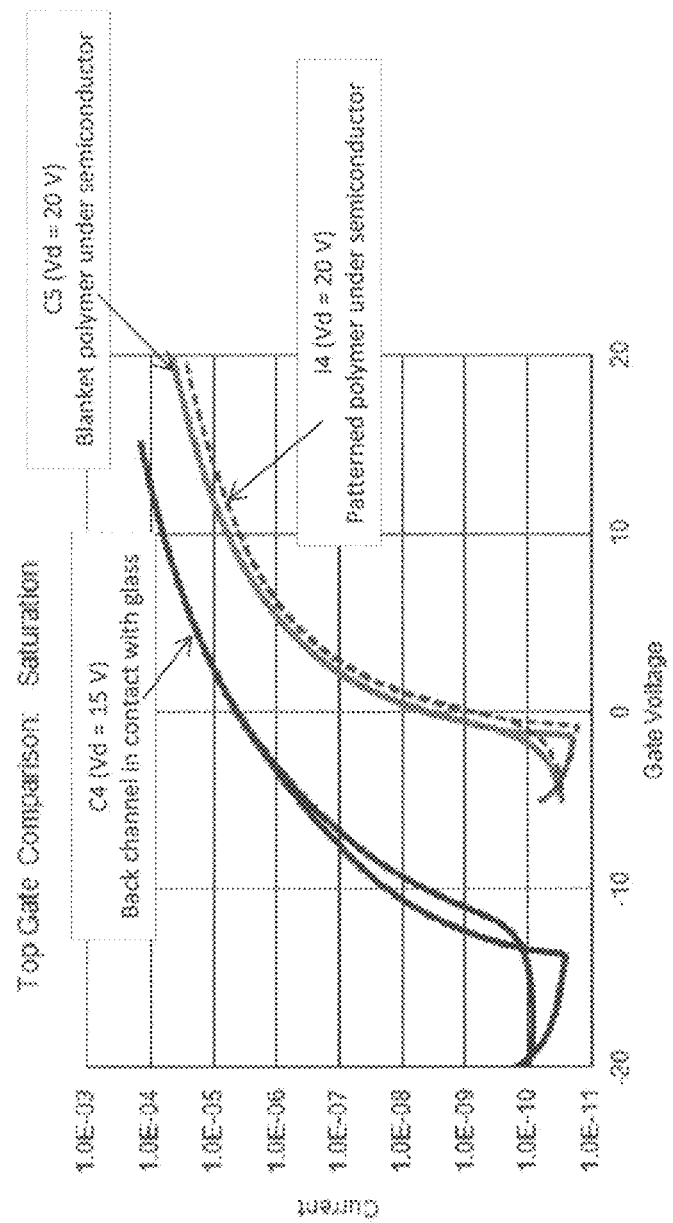
FIG. 23 is a graph showing performance $I_{ds}$-$V_g$ curve characteristics in the saturation regime from the transistors of Comparative Examples C4 and C5, and Inventive Example I4.

Comparative Example C4 was fabricated on a glass substrate, such that the back channel of the semiconductor layer was in contact with the glass. The transistor tested was a top-gate device that was fabricated using the combination of spatial ALD and selective area deposition (SAD). The layers were deposited using the conditions above and patterned with an inkjet-printed inhibitor in the following order: 200 Å of ZnO:N semiconductor layer, 1000 Å AZO source and drain layer, 750 Å $Al_2O_3$ gate dielectric, and 1000 Å of AZO for the gate. The printed inhibitor used to pattern each of the device layers was a 2 wt % PVP in diacetone alcohol solution which was printed using a Fuji Dimatix printer. The transistor dimensions were W=400 microns, and L=95 microns. The data for a representative transistor for Comparative Example C4 can be found in Table 6, with Vd=15 V used for the saturation sweep. The saturation Id-Vg curve for Comparative Example C4 can be found in FIG. 23.

Comparative Example C5

Top Gate TFT on a Glass Substrate with Unpatterned SU-8

Comparative Example C5 was prepared like Comparative Example C4 with the following exceptions. Prior to depositing the semiconductor layer the glass was coated with a uniform SU-8 layer by spin coating a 10% solution of SU-8 2010 in PGMEA and curing at 225° C. for 5 minutes. The nominal layer thickness was 1000 Å. The SU-8 was then treated with a 3 second, 100 W 0.3 Torr oxygen plasma to promote the SALD growth on the SU-8 surface. The sample was then completed as for Comparative Example C4 and analyzed, with Vd=20 V used for the saturation sweep. The results of this testing can be found in Table 6; the saturation Id-Vg curve for Comparative Example C5 can be found in FIG. 23.

Inventive Example I4

Top Gate TFT on a Glass Substrate with Patterned SU-8

Inventive example I4 was prepared as Comparative Example C5 with the following exceptions. After depositing the semiconductor layer over the SU-8 layer, the SU-8 that was not under the semiconductor was removed. The removal was done using a 300 W, 0.4 Torr oxygen plasma for 3 minutes which removed the PVP layer used to pattern the ZnO:N, and the SU-8 layer not protected by the semiconductor. The sample was then completed as for Comparative Example C5 and analyzed, with Vd=20 V used for the saturation sweep. The results of this testing can be found in Table 6.

TABLE 6

| Sample | Linear Mob | Linear Vth | Linear Von | Sat Mob | Sat Vth | Sat Von |
|---|---|---|---|---|---|---|
| C4 | 4.23 | 4.19 | −10.85 | 2.88 | 0.03 | −12.41 |
| C5 | 0.63 | 11.90 | 0.30 | 1.02 | 5.70 | −0.54 |
| I4 | 0.18 | 11.36 | 1.15 | 0.62 | 5.23 | 0.06 |

As can be seen in from Table 6, while the calculated mobility of Comparative Example C4 was higher than the mobility for Comparative Example C5 and Inventive Example I4, the transistors grown directly on the inorganic substrate did not turn off at gate voltage of 0 V. In contrast, the transistors whose semiconductor was deposited on polymer, Comparative Example C5 and Inventive Example I4, exhibit reasonable enhancement mode performance with turn on voltages near zero. A visual comparison of the relative device performance gained from examination of the Id-Vg curves shown in FIG. 23.

The invention has been described in detail with particular reference to certain example embodiments thereof, but it will be understood that variations and modifications can be effected within the scope of the invention.

PARTS LIST 10 providing a substrate
15 providing a patterned polymeric inhibitor
30 depositing an inorganic thin film by ALD
35 optionally treating the surface
40 depositing a material layer
91 exhaust channels
92 metal precursor flow
93 oxidizer-containing flow
95 nitrogen purge flow
97 example substrate
98 arrow
99 gap
101 transistor
103 transistor
104 transistor
105 transistor
106 transistor
107 dual gate transistor
108 vertical transistor
109 vertical transistor
110 substrate
111 vertical transistor
112 transistor
116 transistor
120 gate
125 second gate
130 patterned insulating layer
150 patterned semiconductor layer
160 source
165 drain
170 polymer structure
171 polymer layer
175 polymer layer
178 polymer structure
179 polymer layer
180 inorganic thin film dielectric layer
185 second inorganic thin film dielectric layer
188 inorganic thin film dielectric layer
189 second inorganic thin film dielectric layer
190 multilayer insulating structure
194 passivation layer
195 multilayer insulating structure
200 substrate
208 vertical transistor
220 patterned inhibitor layer
230 regions where inhibitor material is not present
240 patterned inorganic thin film material
250 material layer
470 polymer structure
500 top gate transistor
505 top gate transistor
510 substrate
515 top gate transistor
520 gate
530 patterned insulating layer
550 patterned semiconductor layer
560 source
565 drain
570 polymer layer
575 patterned polymer layer
578 patterned polymer layer
700a,b,c width of top
705a,b,c minimum width defining reentrant profile
710a,b,c first side
720a,b,c second side
730a,b,c height of gate structure 820
735a,b,c top electrically conductive gate structure
778 polymer layer
810 substrate
820 electrically conductive gate structure
840a,b,c reentrant profile
845a,b,c reentrant profile
850 patterned insulating layer
860 patterned semiconductor layer
870 first electrode
875 second electrode
880 third electrode
890 multilayer insulating structure
900 delivery head
905 output face
A,A' cross section line
P,P' line defining reentrant profile

The invention claimed is:

1. A transistor comprising:
a substrate;
an electrically insulating polymer layer in contact with the substrate, the electrically insulating polymer layer having a first pattern defining a first area;
an inorganic semiconductor layer over and in contact with the electrically insulating polymer layer and having a second pattern defining a second area, the first area located within the second area;
a source electrode in contact with a first portion of the semiconductor layer;

a drain electrode in contact with a second portion of the semiconductor layer, the source electrode and the drain electrode separated by a gap;

a gate insulating layer in contact with the inorganic semiconductor layer in the gap; and a gate in contact with the gate insulating layer over the gap.

2. The transistor of claim 1, wherein the first pattern and the second pattern are the same.

3. The transistor of claim 1, wherein the first area is smaller than the second area.

4. The transistor of claim 1, wherein the first pattern defines the gap that separates the source electrode and the drain electrode.

5. The transistor of claim 4, wherein the source electrode and the drain electrode are not over the electrically insulating polymer layer.

6. The transistor of claim 1, wherein at least a portion of each of the source electrode and the drain electrode are over at least a portion of the electrically insulating polymer layer and the semiconductor layer.

7. The transistor of claim 1, wherein the inorganic semiconductor is a metal oxide semiconductor.

8. The transistor of claim 7, wherein the metal oxide semiconductor is a ZnO based semiconductor.

9. The transistor of claim 1, wherein the substrate is an inorganic substrate.

10. The transistor of claim 1, wherein the first area is at least 90% of the second area.

11. The transistor of claim 1, wherein the first area is at least 95% of the second area.

* * * * *